US012247883B2

(12) United States Patent
Van Der Pasch et al.

(10) Patent No.: US 12,247,883 B2
(45) Date of Patent: Mar. 11, 2025

(54) WAVELENGTH TRACKING SYSTEM, METHOD TO CALIBRATE A WAVELENGTH TRACKING SYSTEM, LITHOGRAPHIC APPARATUS, METHOD TO DETERMINE AN ABSOLUTE POSITION OF A MOVABLE OBJECT, AND INTERFEROMETER SYSTEM

(71) Applicant: ASML Netherlands B.V., Veldhoven (NL)

(72) Inventors: Engelbertus Antonius Fransiscus Van Der Pasch, Oirschot (NL); Suzanne Johanna Antonetta Geertruda Cosijns, Casteren (NL); Koen Govert Olivier Van De Meerakker, Eindhoven (NL); Ivo Widdershoven, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 116 days.

(21) Appl. No.: 18/048,119

(22) Filed: Oct. 20, 2022

(65) Prior Publication Data
US 2023/0056872 A1 Feb. 23, 2023

Related U.S. Application Data

(62) Division of application No. 16/965,753, filed as application No. PCT/EP2019/050848 on Jan. 15, 2019, now Pat. No. 11,525,737.

(30) Foreign Application Priority Data

Jan. 31, 2018 (EP) ..................................... 18154460
Sep. 27, 2018 (EP) ..................................... 18197177

(51) Int. Cl.
*G01J 9/02* (2006.01)
*G01B 9/02001* (2022.01)
(Continued)

(52) U.S. Cl.
CPC ........ *G01J 9/0246* (2013.01); *G01B 9/02002* (2013.01); *G01B 9/02007* (2013.01);
(Continued)

(58) Field of Classification Search
CPC ............ G01J 9/0246; G01J 2009/0261; G01B 9/02002; G01B 9/02007; G01B 9/02028;
(Continued)

(56) References Cited

U.S. PATENT DOCUMENTS

| 4,765,741 A | 8/1988 | Detro et al. |
| 4,813,783 A * | 3/1989 | Torge ..................... G01N 21/45 356/498 |

(Continued)

FOREIGN PATENT DOCUMENTS

| CN | 102564613 B | 5/2014 |
| EP | 0 401 799 A2 | 12/1990 |

(Continued)

OTHER PUBLICATIONS

International Search Report and Written Opinion of the International Search Authority directed to related International Patent Application No. PCT/EP2019/050848, mailed May 7, 2019; 14 pages.
International Preliminary Report on Patentability directed to related International Patent Application No. PCT/EP2019/050848, issued Aug. 4, 2020; 11 pages.
(Continued)

*Primary Examiner* — Jonathan M Hansen
(74) *Attorney, Agent, or Firm* — Sterne, Kessler, Goldstein & Fox P.L.L.C.

(57) ABSTRACT

The invention provides a wavelength tracking system comprising a wavelength tracking unit and an interferometer system. The wavelength tracking unit has reflection surfaces at stabile positions providing a first reflection path with a
(Continued)

first path length and a second reflection path with a second path length. The first path length is substantially larger than the second path length. The interferometer system comprises: a beam splitter to split a light beam in a first measurement beam and a second measurement beam; at least one optic element to guide the first measurement beam, at least partially, along the first reflection path and the second measurement beam, at least partially, along the second reflection path; a first light sensor arranged at an end of the first reflection path to receive the first measurement beam and to provide a first sensor signal on the basis of the first measurement beam; a second light sensor arranged at an end of the second reflection path to receive the second measurement beam and to provide a second sensor signal on the basis of the second measurement beam; and a processing unit to determine a wavelength or change in wavelength on the basis of the first sensor signal and the second sensor signal.

14 Claims, 11 Drawing Sheets

(51) Int. Cl.
  *G01B 9/02002* (2022.01)
  *G01B 9/02015* (2022.01)
  *G01B 11/00* (2006.01)
  *G03F 7/00* (2006.01)

(52) U.S. Cl.
  CPC ........ *G01B 9/02028* (2013.01); *G01B 11/002* (2013.01); *G03F 7/0002* (2013.01); *G03F 7/70725* (2013.01)

(58) Field of Classification Search
  CPC .............. G01B 9/0201; G01B 9/02027; G01B 9/02072; G01B 11/002; G03F 7/0002; G03F 7/70725
  See application file for complete search history.

(56) References Cited

U.S. PATENT DOCUMENTS

| | | | | |
|---|---|---|---|---|
| 5,483,341 | A | * | 1/1996 | Naganuma ................ G01J 9/02 356/450 |
| 5,517,308 | A | * | 5/1996 | McMurtry ......... G01B 9/02019 356/517 |
| 5,539,520 | A | | 7/1996 | Telle |
| 5,583,638 | A | * | 12/1996 | Cutler ................... G01J 9/0246 356/455 |
| 6,573,996 | B1 | | 6/2003 | Deliwala et al. |
| 6,661,361 | B1 | * | 12/2003 | Lewis ...................... G02F 7/00 341/137 |
| 10,900,838 | B1 | * | 1/2021 | Podmore ............... G01J 3/1895 |
| 2003/0076503 | A1 | * | 4/2003 | Jensen .................. G01J 9/0246 356/450 |
| 2006/0262315 | A1 | | 11/2006 | Spanner |
| 2006/0290937 | A1 | | 12/2006 | Hirata et al. |
| 2011/0211198 | A1 | | 9/2011 | Koda |
| 2013/0038881 | A1 | | 2/2013 | Pesach et al. |
| 2013/0050675 | A1 | * | 2/2013 | Jansen ................ G03F 7/70775 355/72 |
| 2013/0148129 | A1 | | 6/2013 | Warden et al. |
| 2014/0307263 | A1 | | 10/2014 | Hatada |
| 2015/0019160 | A1 | | 1/2015 | Thurner et al. |
| 2018/0045500 | A1 | | 2/2018 | Chen et al. |
| 2022/0365400 | A1 | * | 11/2022 | Zeiler ..................... G02F 1/212 |
| 2023/0056872 | A1 | * | 2/2023 | Van Der Pasch .. G01B 9/02002 |
| 2023/0239046 | A1 | * | 7/2023 | Zeiler ................. H04B 10/614 385/3 |

FOREIGN PATENT DOCUMENTS

| | | |
|---|---|---|
| EP | 0 657 713 A2 | 6/1995 |
| JP | 2000 100704 A | 4/2000 |
| JP | 2010 238933 A | 10/2010 |
| JP | 5002613 B2 | 8/2012 |

OTHER PUBLICATIONS

Bechstein, K. et al., "Absolute interferometric distance measurements applying a variable synthetic wavelength," *Journal of Optics*, vol. 29, No. 3, Jun. 1, 1998, pp. 179-182.

* cited by examiner

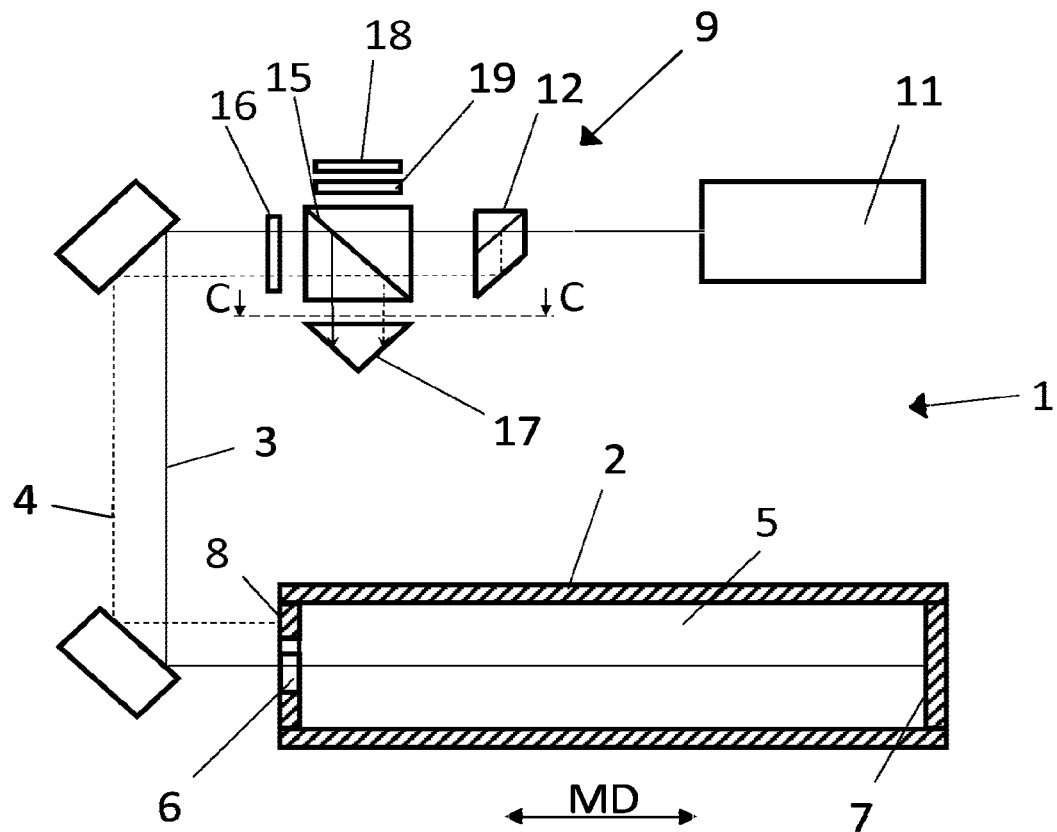
Figure 2 (A-A)
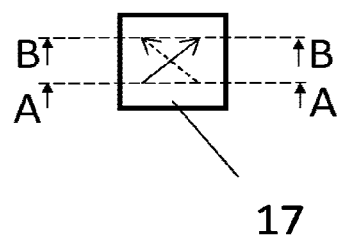
Figure 3 (C-C)

Figure 4 (B-B)
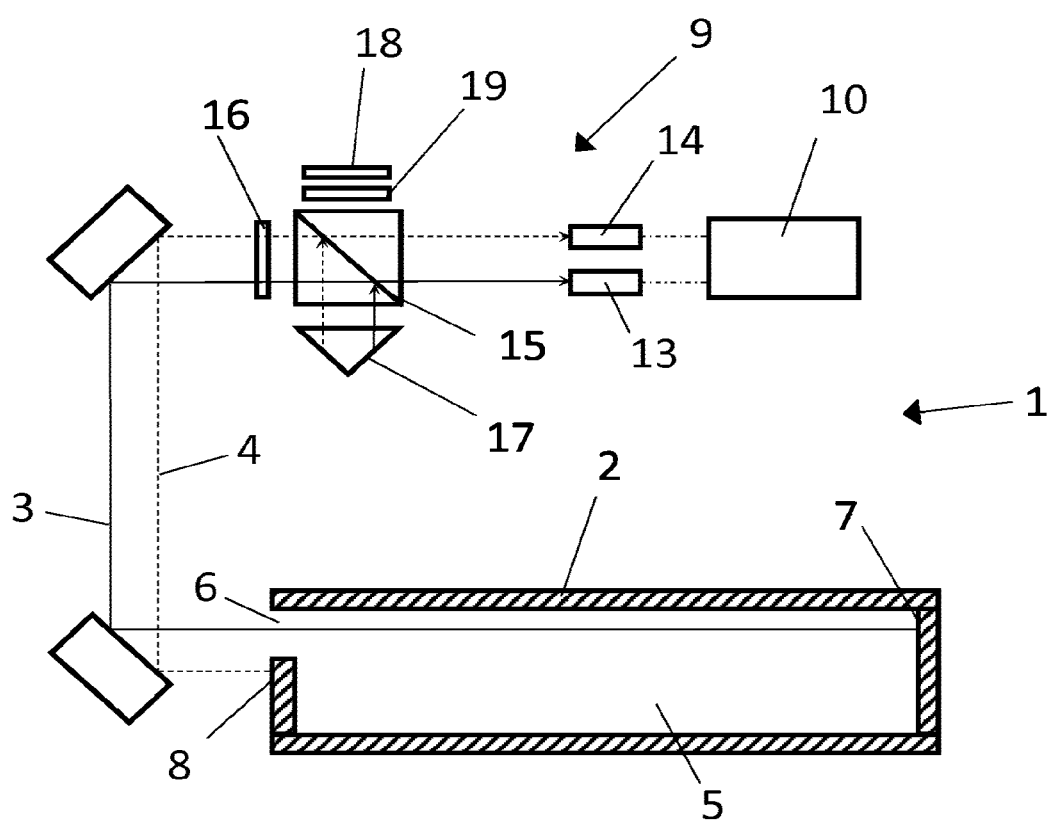

Figure 5 (A-A)
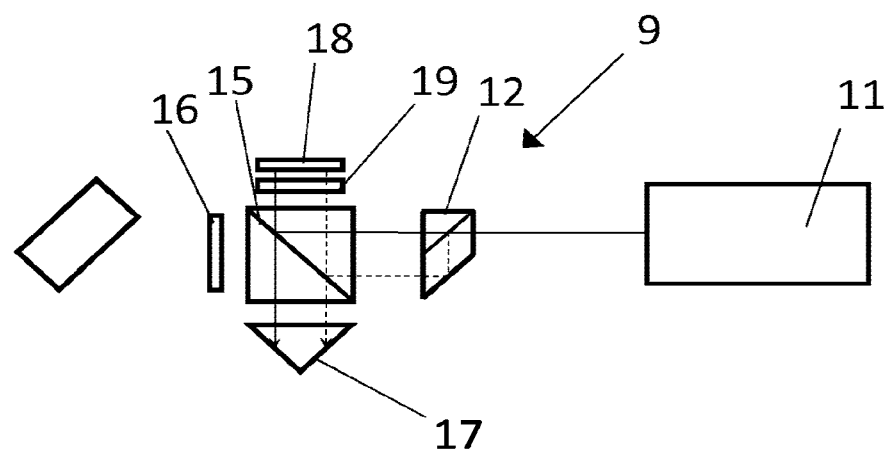
Figure 6 (B-B)
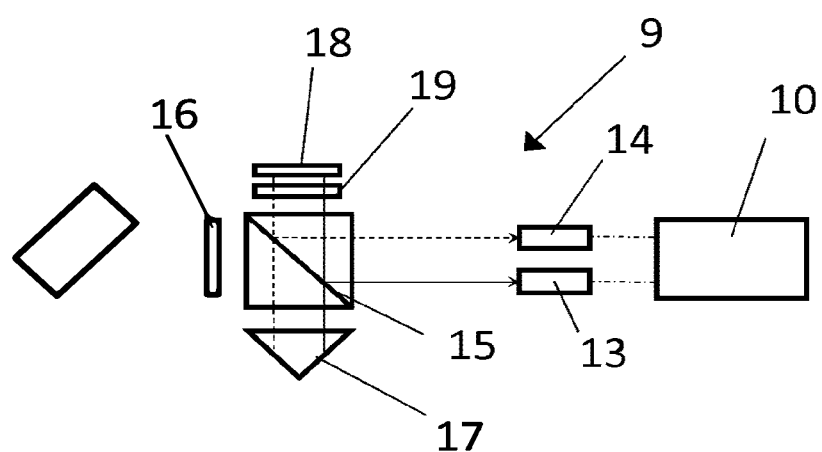

WAVELENGTH TRACKING SYSTEM, METHOD TO CALIBRATE A WAVELENGTH TRACKING SYSTEM, LITHOGRAPHIC APPARATUS, METHOD TO DETERMINE AN ABSOLUTE POSITION OF A MOVABLE OBJECT, AND INTERFEROMETER SYSTEM

CROSS REFERENCE TO RELATED APPLICATIONS

This application is a divisional application of U.S. patent application Ser. No. 16/965,753, 371(c) date of Jul. 29, 2020, which is a U.S. National Stage Entry of International Application No. PCT/EP2019/050848, filed on Jan. 15, 2019, which claims priority of EP application 18154460.2, filed on Jan. 31, 2018, and EP application 18197177.1, filed on Sep. 27, 2018, which are incorporated herein in their entireties by reference.

FIELD OF THE INVENTION

A first aspect of the present invention relates to a wavelength tracking system, a method to calibrate a wavelength tracking system and a lithographic apparatus.

A second aspect of the present invention relates to a method to determine an absolute position of a movable object with respect to a reference location using an interferometer system. The second aspect of the invention further relates to an interferometer system to carry out such method, and a lithographic apparatus comprising such interferometer system.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In embodiments of a lithographic apparatus, interferometers are used to determine the position of movable objects with high accuracy. Examples of these movable objects are the substrate support and movable optic elements, for example mirror elements of the projection optics box.

In certain types of lithographic apparatus this position measurement takes place in a conditioned space, in particular a space with reduced pressure. This space with reduced pressure is also indicated as vacuum space. The vacuum space may be subdivided in multiple sub-spaces between which gas locks are provided to avoid that particles will move from one sub-space to another sub-space. For example, the substrate support may be arranged in a first vacuum sub-space and the movable mirror elements of the projection optics box may be arranged in a second vacuum sub-space.

The gas lock that is provided between the first vacuum sub-space and the second vacuum sub-space may be configured to supply H2-gas as a particle avoidance medium from the first vacuum sub-space to the second sub-space. Over time, the concentration of H2 in the first vacuum subspace and the second vacuum sub space may vary, due to flow restriction variations, for example due to a moving substrate support. Variation in H2 concentration, also referred to as local H2 pressure variation, will induce refractive index changes as seen by the position measurement interferometers. These changes in the refractive index, if not compensated, will result in position measurement errors that will have a significant effect on the measurement accuracy of the position measurement interferometers. The sensitivity of the position measurement interferometers may for example be about 1.4 nm/m/Pa H2 pressure.

Furthermore, each projection optics box mirror elements may require a separate laser source because of required noise level per axis. The basic wavelength stability of a laser source, may not be sufficient to achieve the desired accuracy.

Both effects, refractive index changes due to variation in H2 concentration as well as wavelength stability of the multiple laser sources can be compensated by using a wavelength tracking system. In such wavelength tracking system a stabile cavity is used as a local actual wavelength reference. In the wavelength tracker an interferometer is measuring the difference in length between a first reflection path to a first reflection surface within the cavity and a second reflection path to a second reflection surface at the entrance of the cavity. Due to the difference in length between the first reflection path and the second reflection path, a wavelength or refractive index change will be measured. Since the cavity is stable, i.e. the first reflection surface and the second reflection surface do not move with respect to each other, the measurements do not comprise the effects of changes in the mutual positions of the first reflection surface and the second reflection surface, and can therefore be used to determine the wavelength or change in wavelength.

In the wavelength tracking system an optical differential interferometer is used. Such optical differential interferometer requires a relatively complex structure with multiple polarizing beam splitters, corner cubes, etc. This results in a relatively long optical path with long glass lengths.

Another drawback of most known interferometers is that an interferometer is only able to determine relative displacements of the movable object with respect to a reference location. In order to determine an absolute position of the movable object with respect to the reference location a separate zeroing sensor is provided. This zeroing sensor is used to determine an absolute starting position of the movable object. Once this absolute starting position is known, the interferometer may determine a relative displacement of the movable object with respect to this absolute starting position in order to calculate an absolute position of the movable object.

The zeroing sensor is normally mounted at a specific location at which the absolute starting position of the movable object may be determined. The absolute position of the movable object may therefore only be determined when the movable object is within a relatively small measurement range of the zeroing sensor. The measurement range of the zeroing sensor is typically close to the zeroing sensor, for example within a few centimeters of the zeroing sensor. Each time the measurement of the movable object is started using the interferometer, the movable target has to be brought back into the relatively small measurement range of the zeroing sensor of the position measurement system. This may not only be the case when the lithographic apparatus is started, but for example also when the movable object is shortly out of view of the interferometer, for example when passing behind another movable object.

SUMMARY OF THE INVENTION

It is an object of a first aspect of the invention to provide a wavelength tracking system that is of relatively simple construction requiring a relatively short optical path, or at least to provide an alternative wavelength tracking system. It is a further object the first aspect of the invention to apply such wavelength tracking system in a lithographic apparatus.

It is an object of the second aspect of the invention to provide an improved method to determine an absolute position of a movable object with respect to a reference location using an interferometer system, that may take into account movements of the movable object during measurements to determine the absolute position of the movable object.

According to an aspect of the invention, there is provided a wavelength tracking system comprising:
  a wavelength tracking unit with reflection surfaces at stabile positions providing a first reflection path with a first path length and a second reflection path with a second path length, wherein the first path length is substantially larger than the second path length, and
  an interferometer system, wherein the interferometer system comprises:
    a beam splitter to split a light beam in a first measurement beam and a second measurement beam,
    at least one optic element to guide the first measurement beam, at least partially, along the first reflection path and the second measurement beam, at least partially, along the second reflection path,
    a first light sensor arranged at an end of the first reflection path to receive the first measurement beam and to provide a first sensor signal on the basis of the first measurement beam,
    a second light sensor arranged at an end of the second reflection path to receive the second measurement beam and to provide a second sensor signal on the basis of the second measurement beam, and
  a processing unit to determine a wavelength or change in wavelength on the basis of the first sensor signal and the second sensor signal.

According to an aspect of the invention, there is provided a method to calibrate a wavelength tracking system according to the invention, comprising the steps of:
  moving the wavelength tracking unit in a measurement direction relative to the interferometer system,
  obtaining the first sensor signal from the first sensor and the second sensor signal of the second sensor,
  determining non-linearity of the first reflection path of the wavelength tracking system on the basis of the first sensor signal, and/or
  determining non-linearity of the second reflection path of the wavelength tracking system on the basis of the second sensor signal.

According to an aspect of the invention, there is provided a lithographic apparatus comprising:
  a conditioned space,
  a movable object arranged within the conditioned space,
  an interferometer position measurement system to measure a position of the movable object within the conditioned space, and
  the wavelength tracking system according to the invention,
  wherein the interferometer position measurement system is arranged to receive a wavelength or change in wavelength as determined by the wavelength tracking system and to compensate measurements of the interferometer position measurement system for the wavelength or change in wavelength.

According to an aspect of the invention, there is provided method to determine an absolute position of a movable object with respect to a reference location using an interferometer system, wherein said interferometer system comprises:
  a first light source arranged to provide a first beam and a second beam with a first light frequency;
  a second light source arranged to provide a further first beam and a further second beam with a second light frequency, wherein the second light frequency is a tunable light frequency;
  said method comprising the steps of:
    projecting simultaneously the first beam and the further first beam along a measurement path on a reflective surface of the movable object and projecting the second beam and the further second beam along a reference path on a reference mirror while changing the tunable light frequency of the second light source, the reference path having a fixed length,
    determining a first measurement phase value based on the first beam, a second measurement phase value based on the further first beam, a first reference phase value based on the second beam and a second reference phase value based on the further second beam,
    determining the absolute position based on the first measurement phase value, the second measurement phase value, the first reference phase value and the second reference phase value.

According to an aspect of the invention, there is provided an interferometer system to determine a position of a movable object having a reflective measurement surface, comprising:
  a first light source to provide a first beam and a second beam with a first light frequency,
  a second light source to provide a further first beam and a further second beam with a second light frequency, wherein the second light frequency is a tunable light frequency,
  a reflective reference surface,
  a light sensor,
  wherein the interferometer system is arranged to perform the method according to the invention.

According to an aspect of the invention, there is provided a lithographic apparatus, comprising the interferometer system according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 shows a cross-section at a first measurement plane of a first embodiment of a wavelength tracking system according to a first aspect of the invention, in which the reflection path beams are depicted;

FIG. 3 shows a cross section indicating the first measurement plane A-A and the second measurement plane B-B of the wavelength tracking system of FIG. 2;

FIG. 4 shows a cross-section at a second measurement plane of the embodiment of FIG. 2, in which the reflection path beams are depicted;

FIG. 5 shows partially the cross-section of FIG. 2, in which the reference beams are depicted;

FIG. 6 shows partially the cross-section of FIG. 4, in which the reference beams are depicted;

DETAILED DESCRIPTION

Figure 1:
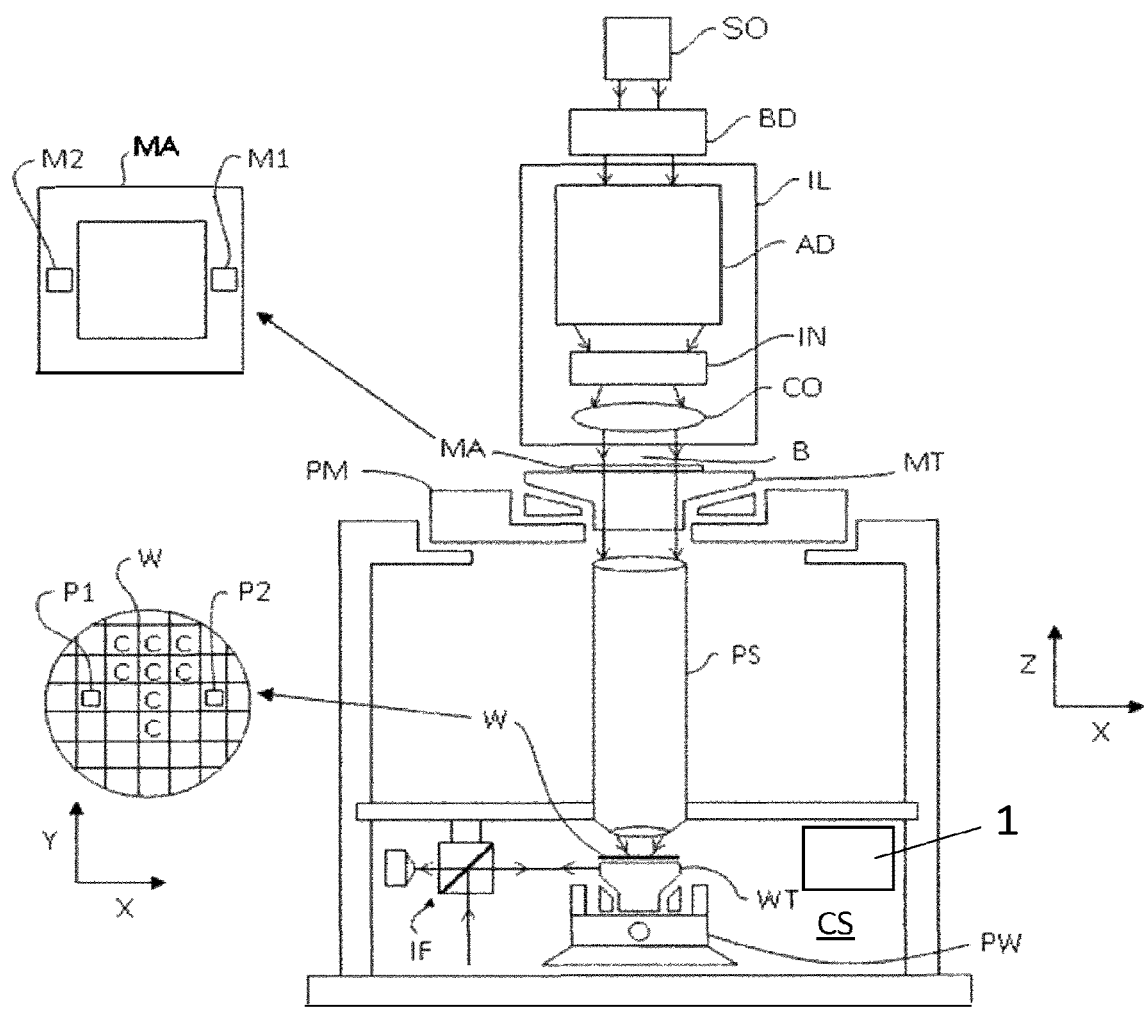
FIG. 1 depicts a lithographic apparatus according to an embodiment of a first aspect of the invention.

FIG. 1 schematically depicts a lithographic apparatus according to one embodiment of the invention. The apparatus comprises an illumination system IL, a support structure MT, a substrate table WT and a projection system PS.

The illumination system IL is configured to condition a radiation beam B. The support structure MT (e.g. a mask table) is constructed to support a patterning device MA (e.g. a mask) and connected to a first positioner PM configured to accurately position the patterning device in accordance with certain parameters. The substrate table WT (e.g. a wafer table) is constructed to hold a substrate W (e.g. a resist-coated wafer) W and connected to a second positioner PW configured to accurately position the substrate in accordance with certain parameters. The projection system PS is configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The term "radiation beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam B in different directions. The tilted mirrors impart a pattern in a radiation beam B which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables WT (and/or two or more mask tables). In such "multiple stage" machines the additional tables may be used in parallel, or preparatory steps may be carried out on one or more tables while one or more other tables are being used for exposure. In addition to one or more substrate tables WT, the lithographic apparatus may have a measurement stage that is arranged to be at a position beneath the projection system PS when the substrate table WT is away from that position. Instead of supporting a substrate W, the measurement stage may be provided with sensors to measure properties of the lithographic apparatus. For example, the projection system may project an image on a sensor on the measurement stage to determine an image quality.

The lithographic apparatus may also be of a type wherein at least a portion of the substrate W may be covered by a liquid having a relatively high refractive index, e.g. water, so as to fill a space between the projection system and the substrate. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illumination system IL receives a radiation beam B from a radiation source SO. The radiation source SO and the lithographic apparatus may be separate entities, for example when the radiation source SO is an excimer laser. In such cases, the source is not considered to form part of the lithographic apparatus and the radiation beam B is passed from the radiation source SO to the illumination system IL with the aid of a beam delivery system BD comprising, for example, suitable directing mirrors and/or a beam expander. In other cases the radiation source SO may be an integral part of the lithographic apparatus, for example when the radiation source SO is a mercury lamp. The radiation source SO and the illuminator IL, together with the beam delivery system BD if required, may be referred to as a radiation system.

The illumination system IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illumination system can be adjusted. In addition, the illumination system IL may comprise various other components, such as an integrator IN and a condenser CO. The illumination system IL may be used to condition the radiation beam B, to have a desired uniformity and intensity distribution in its cross-section.

The radiation beam B is incident on the patterning device MT, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module and a short-stroke module, which form part of the first positioner PM. The long-stroke module may provide coarse positioning of the short-stroke module over a large range of movement. The short-stroke module may provide fine positioning of the support structure MT relative to the long-stroke module over a small range of movement. Similarly, movement of the substrate table WT may be realized using a long-stroke module and a short-stroke module, which form part of the second positioner PW. The long-stroke module may provide coarse positioning of the short-stroke module over a large range of movement. The short-stroke module may provide fine positioning of the substrate table WT relative to the long-stroke module over a small range of movement. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the mask alignment marks M1, M2 may be located between the dies.

The depicted apparatus could be used in at least one of the following modes:

In a first mode, the so-called step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In a second mode, the so-called scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In a third mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the lithographic apparatus as shown in FIG. 1, a conditioned space CS is provided. Typically, a reduced pressure, also referred to as vacuum, is provided in this conditioned space CS to provide advantageous conditions for the lithographic process that is carried out in this conditioned space CS. The conditioned space CS may be subdivided in vacuum sub-spaces. Typically, the substrate support may be arranged in a vacuum sub-space to avoid that effects caused by movement of the substrate support are not propagated to other movable elements, such as mirror elements of the projection optics box that are arranged in another vacuum sub-space. To prevent that particles are transported from one vacuum sub-space to another vacuum sub-space gas locks are provided, in particular a gas lock that supplies H2-gas as a particle avoidance medium from one vacuum sub-space to another vacuum sub-space.

Due to flow restriction variations, for example due to movement of the substrate support in one vacuum subspace, the concentration of H2 in the vacuum sub-spaces may vary. This variation in H2 concentration, also referred to as local H2 pressure variation, may induce refractive index changes as seen by the position measurement interferometers IF. These changes in the refractive index, if not compensated, will result in position measurement errors that will have a significant effect on the measurement accuracy of the position measurement interferometers. The sensitivity of the position measurement interferometers may for example be about 1.4 nm/m/Pa H2 pressure.

Furthermore, each of the interferometer position measurement systems configured to determine a position of the projection optics box mirror elements may require a separate laser source because of the required noise level per measurement axis. The basic wavelength stability of each laser source may not be sufficient to reliably compare results of the different interferometer position measurement systems.

To compensate one or both of these effects, the lithographic apparatus is provided with a wavelength tracking system 1 which is arranged in the conditioned space CS to track the wavelength or a change in the wavelength.

FIGS. 2 to 6 show an embodiment of a wavelength tracking system 1 according to an embodiment of the invention in more detail. The wavelength tracking system 1 comprises a first reflection path 3 with a first path length and a second reflection path 4 with a second path length. The first path length is larger than the second path length. This difference in path length is defined by a wavelength tracking unit 2.

The wavelength tracking unit 2 comprises a wavelength tracking cavity 5 comprising a cavity opening 6. A first reflection path reflection surface 7 is provided at an end surface of the wavelength tracking cavity 5 opposite to the cavity opening 6. The first reflection path reflection surface 7 is arranged in the first reflection path 3. A second reflection path reflection surface 8 is provided next to the cavity opening 5. The second reflection path reflection surface 8 is arranged in the second reflection path 4.

The wavelength tracking unit 2 is constructed such that the distance between the first reflection path reflection surface 7 and the second reflection path reflection surface 8 is stable, i.e. constant. This means that there is a constant length difference between the length of the first reflection path 3 and the length of the second reflection path 4. This constant difference in distance enables the wavelength tracking system 1 to determine a wavelength or change in wavelength of the light beam.

The wavelength tracking system 1 further comprises an interferometer system 9 and a processing unit 10.

The interferometer system 9 comprises a light beam source 11 arranged to provide a light beam, in particular a laser light beam having at least a first polarization direction and a second polarization direction. The light beam is received by a beam splitter 12 arranged to split the light beam in a first measurement beam and a second measurement beam. The beam splitter 12 is a non-polarizing 50% beam splitter. Thus, the first measurement beam and the second measurement beam each contain lights with polarization in at least the first polarization direction and the second polarization direction. The interferometer system 9 comprises multiple optic elements, as will be discussed below in more detail, to guide the first measurement beam, at least partially, along the first reflection path 3 and the second measurement beam, at least partially, along the second reflection path 4.

A first light sensor 13 is arranged at an end of the first reflection path to receive the first measurement beam and to provide a first sensor signal on the basis of the first measurement beam. A second light sensor 14 is arranged at an end of the second reflection path 4 to receive the second measurement beam and to provide a second sensor signal on the basis of the second measurement beam.

The first measurement beam and the second measurement beam run through a first measurement plane A-A and a second measurement plane B-B, that are arranged parallel to each other. The first measurement plane and the second measurement plane are indicated in FIG. 3. It can be seen that the light beam source 11 is arranged in the first measurement plane A-A and the first light sensor 13 and the second light sensor 14 are arranged in the second measurement plane B-B.

The first measurement beam and the second measurement beam created in the beam splitter 12 are guided into a polarizing beam splitter 15. The polarizing beam splitter 15 splits the first measurement beam in a first reflection path beam (shown in FIGS. 2 and 4) having the first polarization direction and a first reference beam (shown in FIGS. 5 and 6) having the second polarization direction. Correspondingly, the polarizing beam splitter 15 splits the second measurement beam in a second reflection path beam (shown in FIGS. 2 and 4) having the first polarization direction and a second reference beam (shown in FIGS. 5 and 6) having the second polarization direction.

The first reflection path beam propagates, as shown in FIG. 2, from the polarizing beam splitter 15 along the first reflection path 3 to the wavelength tracking unit 2 and through the cavity opening 6 to the first reflection path reflection surface 7. The first reflection path beam is reflected on the first reflection path reflection surface 7 and returns along the first reflection path 3 to the polarizing beam splitter 15. The first reflection path beam has now passed twice a quarter lambda plate 16, and is, as a result reflected by the polarizing beam splitter 15 towards a corner cube 17. In the corner cube 17, the first reflection path beam is transferred from the first measurement plane A-A to the second measurement plane B-B, as shown in FIG. 3.

As can be seen in FIG. 4, the first reflection path beam is, in measurement plane B-B, again reflected by the polarizing beam splitter 15 along the first reflection path 3 to run through the cavity opening 6 into the wavelength tracking cavity 5, where it is reflected by the first reflection path reflection surface 7 and returns to the polarizing beam splitter 15. It is remarked that in the second measurement plane B-B, the cavity opening 6 is arranged at a different height to ensure that the first reflection path beam will enter the wavelength tracking cavity 5. While running to and from the wavelength tracking unit 2, the first reflection path beam will again pass twice the quarter lambda plate 16, and as a result, the first reflection path beam will run through the polarizing beam splitter 15 to the first light sensor 13.

Again referring to FIG. 2, the second reflection path beam propagates from the polarizing beam splitter 15 along the second reflection path 4 to the wavelength tracking unit 2 where it is reflected on the second reflection path reflection surface 8 back to the polarizing beam splitter 15. The second reflection path beam passes twice the quarter lambda plate 16 and is reflected in the polarizing beam splitter 15 towards the corner cube 17. In the corner cube 17, the second reflection path beam is transferred from the first measurement plane A-A to the second measurement plane B-B, as shown in FIG. 3.

In the second measurement plane B-B, the second reflection path beam is, see FIG. 4, again reflected by the polarizing beam splitter 15 along the second reflection path 4 where it is reflected by the second reflection path reflection surface 8 next to the cavity opening 6. The second reflection path beam returns to the polarizing beam splitter 15 and will pass it. The second light sensor 14 is arranged to receive the second reflection path beam coming from the polarizing beam splitter 15.

FIGS. 5 and 6 show the propagation paths of the first reference beam and the second reference beam in the first measurement plane A-A and the second measurement plane B-B, respectively. It is remarked that the wavelength tracking unit 2 is not depicted in FIGS. 5 and 6. The first and second reference beam are formed, as shown in FIG. 5 by parts of the first and second measurement beam, respectively, that are reflected on the polarizing beam splitter 15. The first reference beam and the second reference beam are reflected on a reference mirror 18 back to the polarizing beam splitter 15, while passing twice a quarter lambda plate 19. The polarizing beam splitter 15 will now transmit the first and second reference beam to the corner cube 17, where the first and second reference beam are transferred from the first measurement plane A-A shown in FIG. 5 to the second measurement plane B-B shown in FIG. 6.

In the second measurement plane B-B, the first and second reference beam will again be transmitted by the polarizing beam splitter 15 to the reference mirror 18 and reflected thereon, thereby passing twice the quarter lambda plate 19. This will result in reflection of the first reference beam and the second reference beam on the polarizing beam splitter 15 such that the first reference beam will be guided towards the first light sensor 13 and the second reference beam will be guided towards the second light sensor 14, respectively.

The first light sensor 13 will provide a first sensor signal on the basis of the first reflection path beam and the first reference beam received by the first light sensor 13 and the second light sensor 14 will provide a second sensor signal on the basis of the second reflection path beam and the second reference beam received by the second light sensor 14. The first sensor signal and the second sensor signal are fed into the processing unit 10. The processing unit 10 may be a local processing unit, or may be part of another processing device, for example a processing device of an interferometer position measurement system or a central processing device of the lithographic apparatus.

In the processing unit 10, the second sensor signal is subtracted from the first sensor signal to determine a differential signal. By monitoring this differential signal the wavelength or change in wavelength can be monitored.

The interferometer position measurement system IF, as shown in FIG. 1, is arranged to receive the wavelength or change in wavelength as determined by the wavelength tracking system and to compensate measurements of the interferometer position measurement systems for the wavelength or change in wavelength. With this compensation the effects of refractive index changes due to variation in H2 concentration in the conditioned space CS as well as wavelength stability of individual interferometers may be compensated.

An important advantage of the embodiment of wavelength tracking system 1 of the invention as, for example, shown in FIGS. 2 to 6 is that the interferometer system 9 is of relatively simple optical design. The optic elements of the interferometer system 9 only comprise one non-polarizing beam splitter 12, one polarizing beam splitter 15 and one corner cube 17. Further, due to the limited number of required optic elements, the interferometer system 9 also requires a limited optical glass length, i.e. the first measurement beam and the second measurement beam only pass the non-polarizing beam splitter 12, the polarizing beam splitter 15, the corner cube 17, and the quarter lambda plates 16 or 19.

The relatively simple optic design is possible as the first measurement beam and the second measurement beam are not optically combined and guided to a single light sensor, but for each measurement beam a separate light sensor is provided. The first light sensor 13 is arranged to receive the first reflection path beam and the first reference beam of the first measurement beam, and the second light sensor 14 is arranged to receive the second reflection path beam and the second reference beam of the second measurement beam. The first measurement beam and second measurement beam are electronically compared, in the processing unit 10, by comparison, in particular subtraction, of the first sensor signal and the second sensor signal.

A further advantage of the wavelength tracking system 1 is that the system allows to calibrate the wavelength tracking system 1 for non-linearities. This calibration can carried out by a relative movement of the wavelength tracking unit with respect to the interferometer system 9 in the measurement direction MD (see FIG. 2) of at least one signal period. This relative movement can be created by moving the wavelength tracking unit 2 with respect to the interferometer system 9 and/or by moving the interferometer system 9 with respect to wavelength tracking unit 2. During the relative movement the first sensor signal of the provided by the first light sensor 13 and the second sensor signal provided by the second light sensor 14 are received by the processing unit 10.

The first sensor signal provided by the first light sensor 13 can then be used, for example in the processing unit 10, to determine the non-linearity of the first reflection path 3 of the wavelength tracking system 1. Correspondingly, the second sensor signal provided by the second light sensor 14 can be used to determine the non-linearity of the second reflection path 4 of the wavelength tracking system 1.

Figure 7:
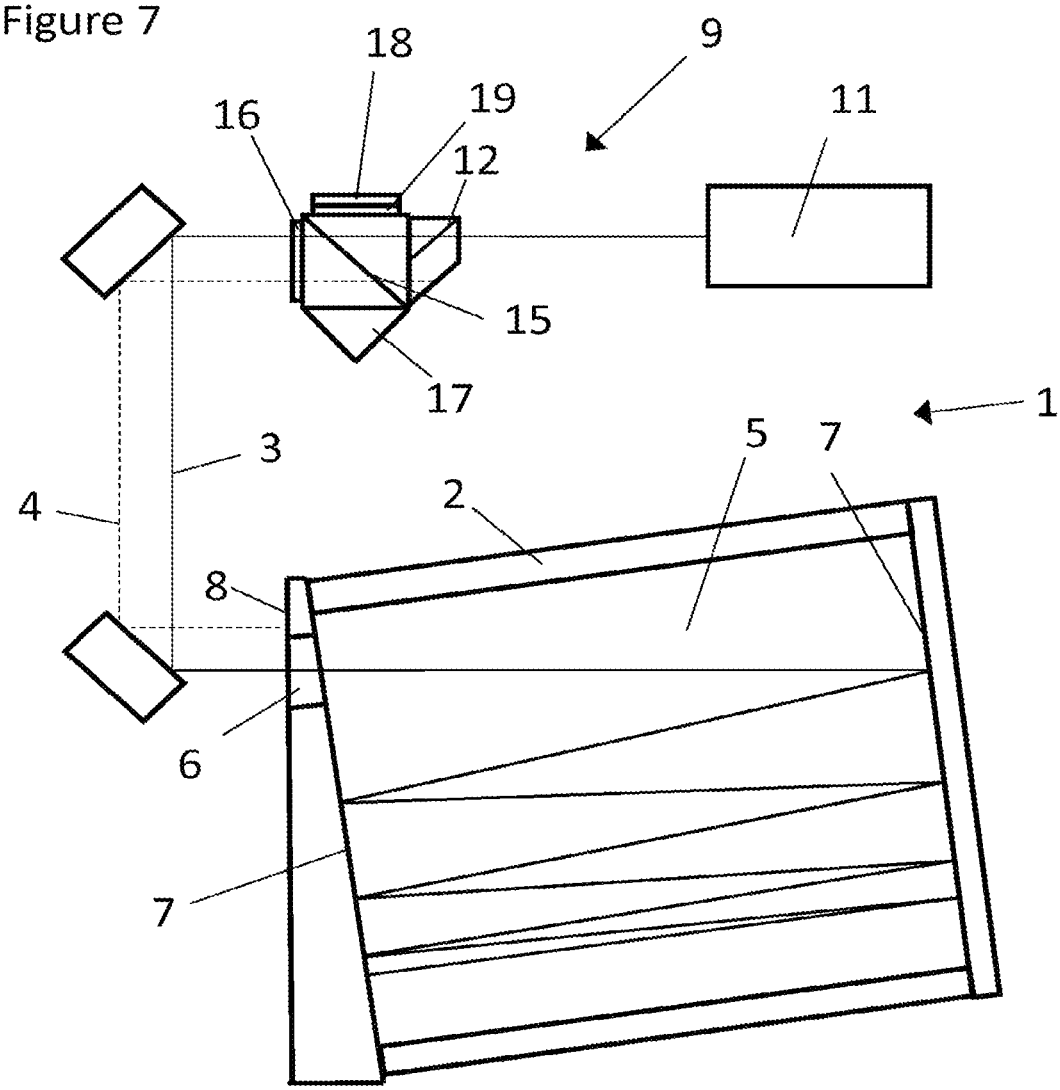
FIG. 7 shows a cross-section at a first measurement plane of a second embodiment of a wavelength tracking system according to a first aspect of the invention.

FIG. 7 shows an alternative embodiment of a wavelength tracking system 1 in the first measurement plane, i.e. the measurement plane in which the light beam source 10 is arranged. The same part or parts having the same function are indicated by the same reference numerals.

Generally, the wavelength tracking system 1 of FIG. 7 functions the same as the wavelength tracking system of FIGS. 2-6. However, the wavelength tracking unit 2 is constructed differently. The wavelength tracking unit 2 of this embodiment has multiple first reflection path reflection surfaces 7 such that within the wavelength tracking cavity 5, the first reflection path beam is multiple times reflected before leaving the wavelength tracking cavity 5 through the cavity opening. These multiple reflections result in a relatively long reflection path in a relatively small space. As a result, the difference in distance between the first reflection path 3 and the second reflection path 4 is made relatively large which facilitates measuring a wavelength or change in wavelength using the wavelength tracking system 1 as described with respect to FIGS. 2-6.

Further, in the wavelength tracking system 1 of FIG. 7, the non-polarizing beam splitter 12, the polarizing beam splitter 15, the corner cube 17, the quarter lambda plates 16 and 19 and the reference mirror 18 are integrated in a single optical unit. Such single optical unit requires relatively little space and can be optimally tuned.

Finally, it is remarked that the embodiments of FIGS. 2-7 are examples of wavelength tracking systems according to the invention. However, these embodiments should not be regarded as limiting examples.

Figure 8:
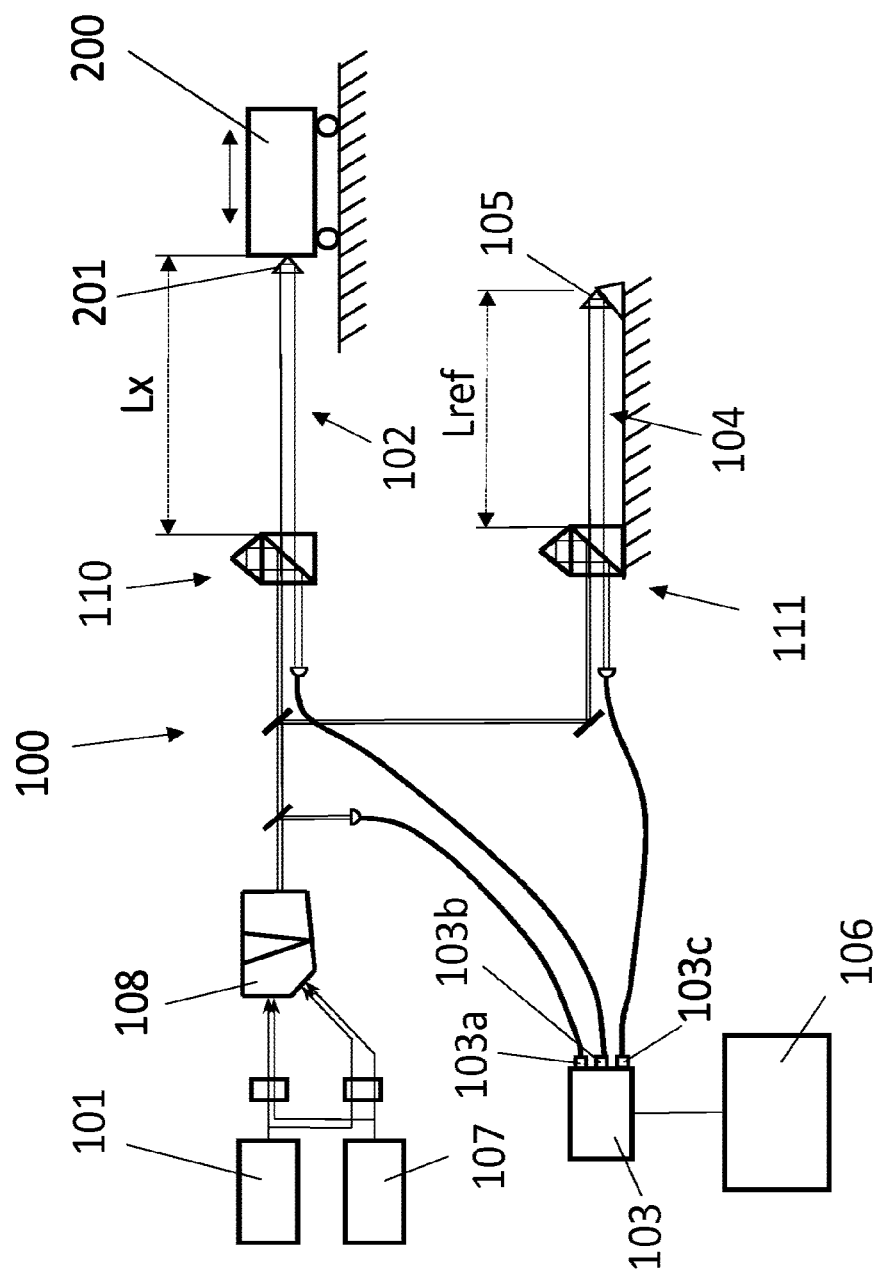
FIG. 8 shows an embodiment of an interferometer system according to a second aspect of the invention.

FIG. 8 shows a first embodiment of an interferometer system 100 according to a second aspect of the invention. The interferometer system 100 is arranged to determine an absolute position of a movable object 200, for example a part of a projection system PS of a lithographic apparatus. The movable object 200 comprises a reflective measurement surface 201.

The interferometer system 100 is a heterodyne interferometer system comprising a first light source 101 to provide a laser beam with fixed light frequency. The first light source 101 will typically provide a laser beam with a fixed frequency, and is for example a stabilized HeNe laser source. The first light source 101 can be used, as known in the art, to provide the laser beam which is split, for example by a non-polarizing beam splitter, into a first part and a second part. The first part is directed to interferometer optics 110. The interferometer optics 110 are arranged to split the first part into a first beam and a first reference beam. The first beam is guided along a measurement path 102, having a measurement path length $L_x$, to the reflective measurement surface 201 on the movable object 200. After the first beam is reflected by the reflective measurement surface 201, the first beam is recombined with the first reference beam in the interferometer optics 110. The recombined first beam and first reference beam are directed to a detector 103b which is connected to a light sensor device 103. The second part of the laser beam is directed to interferometer optics 111. The interferometer optics 111 is arranged to split the second part into a second beam and a second reference beam. The second beam is guided along a reference path 104, having a reference path length $L_{ref}$, to a reflective reference surface 105. After the second beam is reflected by the reflective reference surface 105, the second beam is recombined with the second reference beam in the interferometer optics 111. The recombined second beam and second reference beam are directed to a detector 103c which is connected to the light sensor 103. Part of the laser beam is directed to a detector 103a which is connected to the light sensor device 103. This part of the laser beam has not interacted with the reflective measurement surface 201 or the reflective reference surface 105.

The reflective reference surface 105 is arranged at a fixed location that is used as reference location for measurements. The construction in which the reflective reference surface 105 is provided is therefore intended to be inherently stable, i.e. the location of the reflective reference surface 105 with respect to the interferometer system 100 is constant. The length $L_{ref}$ of the reference path 104 is therefore also a constant length.

The detector 103a propagates the part of the laser beam onto a light diode of the light sensor device 103. The detector 103b propagates the recombined first beam and first reference beam onto another light diode of the light sensor device 103. The detector 103c propagates the recombined second beam and second reference beam onto yet another light diode of light sensor device 103. The measurements of the light diodes are fed via the light sensor device 103 into a processing unit 106. The processing unit 106 generates a first measurement phase value $ph1_x$ based on the input by the detector 103b. Alternatively, the processing unit 106 may generate the first measurement phase value $ph1_x$ based on the input by the detector 103b and the input by the detector 103a to compensate for disturbances of the laser beam between the first light source 101 and the interferometer optics 110. The processing unit 106 generates a first reference phase value $ph1_{ref}$ based on the input by the detector 103c. Alternatively, the processing unit 106 may generate the first reference phase value $ph1_{ref}$ based on the input by the detector 103c and the input by the detector 103a to compensate for disturbances of the laser beam between the first light source 101 and the interferometer optics 111. The first measurement phase value $ph1_x$ represents a distance or displacement of the measurement object 200, i.e., the measurement path length $L_x$. The first reference phase value $ph1_{ref}$ represents the reference path length $L_{ref}$, which is a constant length.

The interferometer system 100 comprises a second light source 107. The second light source 107 has a tunable light frequency. In the shown embodiment, the second light source 107 is configured to provide a second laser beam with a tunable light frequency, for example from a tunable laser source. The second laser beam is split in a further first part and a further second part. Similar to the first part, the further first part is directed to interferometer optics 110. The interferometer optics 110 are arranged to split the further first part into a further first beam and a further first reference beam. The further first beam is guided along the measurement path 102, having the measurement path length $L_x$, to the reflective measurement surface 201 on the movable object 200. After the further first beam is reflected by the reflective measurement surface 201, the further first beam is recombined with the further first reference beam in the interferometer optics 110. The recombined further first beam and further first reference beam are directed to the detector 103b which is connected to the light sensor device 103. The further second part is directed to interferometer optics 111. The interferometer optics 111 are arranged to split the further second part into a further second beam and a further second reference beam. The further second beam is guided along the reference path 104, having the reference path length $L_{ref}$, to the reflective reference surface 105. After the further second beam is reflected by the reflective reference surface 105, the further second beam is recombined with the further second reference beam in the interferometer optics 111. The recombined further second beam and the further second reference beam are directed to the detector 103c which is connected to the light sensor device 103.

Part of the second laser beam is directed to the detector 103a which is connected to the light sensor device 103. This part of the second laser beam has not interacted with the reflective measurement surface 201 or the reflective reference surface 105.

The detector 103a propagates the part of the second laser beam onto a light diode of the light sensor device 103. The detector 103b propagates the recombined further first beam and further first reference beam onto another light diode of the light sensor device 103. The detector 103c propagates the recombined further second beam and further second reference beam onto yet another light diode of light sensor device 103. The measurements of the light diodes are fed via the light sensor device 103 into the processing unit 106. The processing unit 106 generates a second measurement phase value $ph2_x$ based on the input by the detector 103b. Alternatively, the processing unit 106 may generate the second measurement phase value $ph2_x$ based on the input by the detector 103b and the input by the detector 103a to compensate for disturbances of the second laser beam between the second light source 107 and the interferometer optics 110. The processing unit 106 generates a second reference phase value $ph2_{ref}$ based on the input by the detector 103c. Alternatively, the processing unit 106 may generate the second reference phase value $ph2_{ref}$ based on the input by the detector 103c and the input by the detector 103a to compensate for disturbances of the second laser beam between the second light source 107 and the interferometer optics 111. The second measurement phase value $ph2_x$ represents a distance or displacement of the measurement object 200, i.e., the measurement path length $L_x$. The second reference phase value $ph2_{ref}$ represents the reference path length $L_{ref}$, which is a constant length.

Thus, the laser beam and the second laser beam follow the same paths after being combined in a Rochon prism 108 as shown in FIG. 8. In an embodiment, an optical component other than a Rochon prism 108 may be used to combine the laser beam and the second laser beam.

The processing unit 106 is arranged to distinguish the first measurement phase value $ph1_x$, the first reference phase value $ph1_{ref}$, the second measurement phase value $ph2_x$, and the second reference phase value $ph2_{ref}$. The first measurement phase value $ph1_x$ changes due to movements of the moveable object 200. The second measurement phase value $ph2_x$ changes due to movements of the movable object 200 and due to a change in the tunable light frequency of the second laser beam. Since the first light source 101 provides a laser beam with a fixed light frequency, the first measurement phase value $ph1_x$ is representative for the displacement of the movable object 200, while the second measurement phase value $ph2_x$ may be representative for displacements of the movable object 200, and also for frequency changes, i.e. wavelength variations, of the light of the second laser beam.

During measurements with the light sensor device 103, the first measurement phase value $ph1_x$, the second measurement phase value $ph2_x$, the first reference phase value $ph1_{ref}$, and the second reference phase value $ph2_{ref}$ may be measured. A combination of the four measured phase values at a single point in time are indicated, in this application, as a data point. Thus, a data point comprises, for a specific point in time, the first measurement phase value $ph1_x$, the second measurement phase value $ph2_x$, the first reference phase value $ph1_{ref}$, and the second reference phase value $ph2_{ref}$.

Assuming that the movable object 200 will remain at a stationary location during measurement, and the tunable light frequency of the tunable laser source 107 is changed over time, a length ratio $L_{rat}$ between the measurement path length $L_x$ and the reference path length $L_{ref}$ can be determined by the processing unit 106 on the basis of the change of the second measurement phase value $ph2_x$ and the second reference phase value $ph2_{ref}$ over time, as caused by the change in the tunable light frequency of the light in the second laser beam, as:

$$L_{rat} = L_x / L_{ref} = \Delta ph2_x / \Delta ph2_{ref}$$

Since the length of the reference path $L_{ref}$ is constant and known, the absolute position of the movable object 200 can consequently be determined as follows: $L_x = L_{rat} * L_{ref}$.

Thus, the frequency change of the second light source 107 provides sufficient data to calculate the absolute position of the movable object 200 if the movable object 200 remains in a stationary location. However, in practice, the movable object 200 will normally not remain sufficiently stationary to determine the absolute position in this way. The movable object 200 may for instance make a vibrating movement caused by external influences.

According to a method of the second aspect of the invention, it is proposed to select data points according to a selection criterion to compensate for movement of the movable object 200. By compensation of the movement of the movable object 200, the absolute position of the movable object 200 can be determined by the interferometer system 100 itself, i.e. without the need of additional zeroing sensors.

Since the first beam allows to determine any relative displacement of the movable object 200, it can be determined whether the movable object 200 is moved during the measurement of the first measurement phase value $ph1_x$ and the second measurement phase value $ph2_x$. In a first embodiment of such method data points are selected from all collected data points for which a relative position of the movable object 200, as measured with the first beam, is the same. According to this method, all data points that are collected by measurements with the interferometer system 100 are compared. Data points for which the first measurement phase value $ph1_x$ are the same are selected to form a set of data points. This set of data points resembles a measurement sequence in which the movable object 200 is on the same position at each data point, so it looks as if the movable object 200 has not moved.

Figure 9:
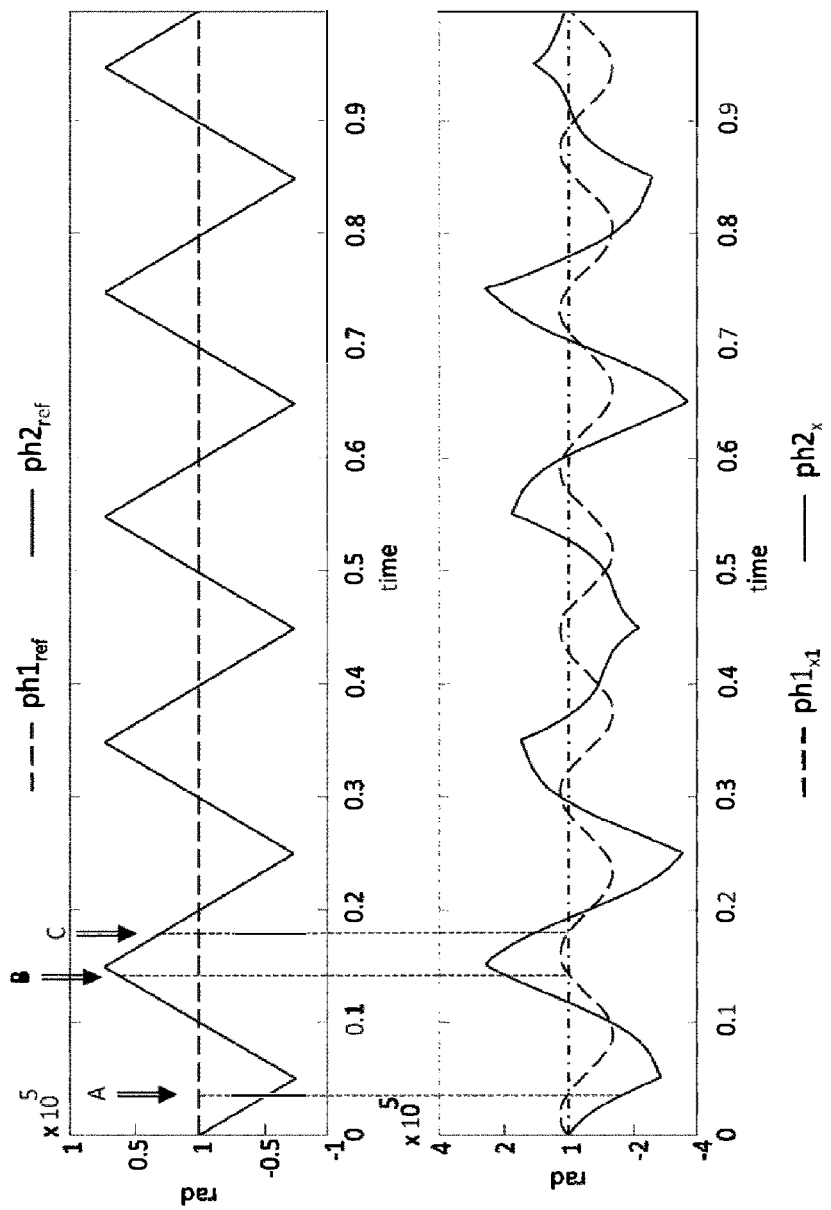
FIG. 9 shows selection of a set of data points according to a first selection criterion of a method according to an embodiment of the second aspect of the invention.

This selection of data points is now explained in more detail with reference to FIG. 9. The upper part of FIG. 9 shows the first reference phase value $ph1_{ref}$ and the second reference phase value $ph2_{ref}$ over time. It can be seen that the constant wavelength of the light of the second beam as provided by the first light source 101 results in a constant value of the first reference phase value $ph1_{ref}$. The modulated wavelength change over time of the light of the further second beam as provided by the second light source 107 results in a modulating value of the second reference phase value $ph2_{ref}$. In the lower part of FIG. 9, the first measurement phase value $ph1_x$ and the second measurement phase value $ph2_x$ over time are depicted resulting from measurements with the first beam of the first light source 101 and the further first beam of the second light source 107. From the course of the first phase value $ph1_x$, it can be seen that the movable object 200 makes back and forth movements in a position range, for example a vibrating movement. The second measurement phase value $ph2_x$ shows the additional effect of the modulating frequency of the further first beam.

In accordance with the embodiment of the method to determine an absolute position of the movable object 200, a plurality of data points having the same first measurement phase value $ph1_x$ are selected to form a set of data points. At least 2 data points are required, but having more than 2 data points helps to determine the absolute position more accurately. In FIG. 9, as an example, three data points A, B and C are indicated that each have a first measurement phase value $ph1_x$ equal to zero. These data points A, B and C can be used as a set of data points. In practice, the set of data points may comprise many more data points. Instead of zero, any other value of the first measurement phase value $ph1_x$ can also be selected as long as for each data point within the set of data points the first measurement phase value $ph1_x$ is equal. It is advantageous to select a value that is available in many data points.

For such set of data points, an absolute position of the movable object 200 can be determined as described above, i.e. the length ratio $L_{rat}$ can be determined on the basis of the second measurement phase value $ph2_x$ and the second reference phase value $ph2_{ref}$. When the length ratio $L_{rat}$ is calculated, the absolute position of the movable object 200 can be calculated from the length ratio $L_{rat}$ and the known length of the reference path 104.

Figure 10:
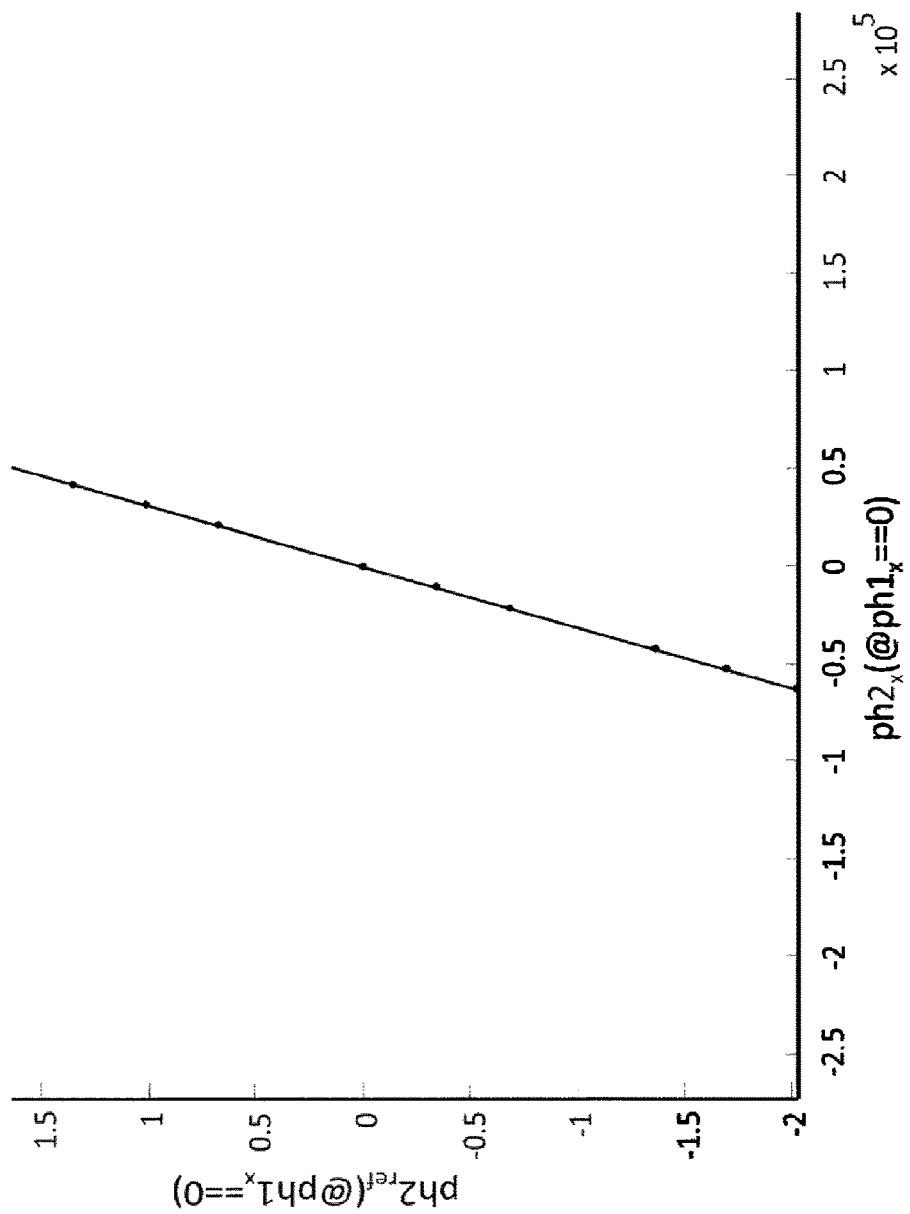
FIG. 10 shows construction of the length ratio in the method of FIG. 9.

As an example, FIG. 10 shows a diagram in which the second measurement phase values $ph2_x$ and the second reference phase values $ph2_{ref}$ of each data point of the set of data points is plotted. It can be seen that a straight line can be fitted through these phase values to determine a length ratio $L_{rat}$ of the set of data points. However, any other method to calculate the length ratio $L_{rat}$ from the set of data points may also be applied.

To improve the results of this method, further sets of data points can be selected from the collected data points, wherein within each set of data points, the first measurement phase values $ph1_x$ are the same. For each set of data points, different values of the first measurement phase value $ph1_x$ may be selected. The absolute positions of the movable object 200 as calculated for each set of data points can be combined, typically averaged, possibly using a weight factor, to determine a single absolute position of the movable object 200 with increased accuracy. The value of the weight factor may for example depend on the number of data points within each set of data points. The value of the weight factor may be higher when there are a large number of data points in a set of data points.

In order to have sets of data points with a substantial number of data points, it is required that the movable object 200 will be regularly positioned in the position that matches with the first measurement phase value $ph1_x$ forming the basis of the set of data points. Therefore, this method in particular works when the movable object 200 makes back and forth movements in a certain position range, for example when making a vibrating movement as shown in FIG. 9.

It is however possible that the movable object 200 does not make back and forth movements, but makes a movement in a single direction, i.e. in a positive direction or a negative direction along an axis. In this case the data points will have no two data points with the same first measurement phase value $ph1_x$.

According to another embodiment of the method of the second aspect of the invention, it is also possible to determine an absolute position of the movable object 200 when the movable object 200 moves in a single direction. This second embodiment is also based on selecting sets of specific data points from a collection of data points, and calculating an absolute position of the movable object 200 from this selected sets of specific data points. The second embodiment assumes that the fixed light frequency of the laser beam of the first light source 101 is constant and the tunable light frequency of the further laser beam of the second light source 107 is modulating. Furthermore, it is assumed that the reference path length $L_{ref}$ is constant, while the measurement path length $L_x$ is not constant, i.e. the movable object 200 is moving.

In the second embodiment, two data points are selected for which the second reference phase value $ph2_{ref}$ are the same. In particular, the step of selecting data points comprises selecting a set of three data points comprising a first data point DP1 at a first point in time T1, a second data point DP2 at a second point in time T2 and a third data point DP3 at a third point in time T3. The first point in time T1, the second point in time T2 and the third point in time T3 do not have to be in chronological order. The second reference phase value for the first data point $ph2_{ref}(T1)$ and the third data point $ph2_{ref}(T3)$ are selected to be the same, while the second reference phase value $ph2_{ref}(T2)$ of the second data point is selected to be different than the second reference phase value for the first data point $ph2_{ref}(T1)$ and the third data point $ph2_{ref}(T3)$.

On the basis of this set of three data points, an absolute position of the movable object 200 on the point of time T2 can be calculated as follows.

$$L_{rat}(T2) = \Delta ph2_x(T2,T1)/\Delta ph2_{ref}(T2,T1) - [\Delta ph1_x(T2,T1) * \Delta ph2_{ref}(T3,T1)]/[\Delta ph2_x(T3,T1) * \Delta ph2_{ref}(T2,T1)],$$

wherein $L_{rat}(T2)$ is the length ratio between $L_x$ and $L_{ref}$ at T2, $\Delta ph2_x(T2, T1)$ is the change in the second measurement phase value $ph2_x$ between T2 and T1, $\Delta ph2_{ref}(T2, T1)$ is the change in the second reference phase value $ph2_{ref}$ between T2 and T1, $\Delta ph1_x(T2, T1)$ is the change in the first measurement phase value $ph1_x$ between T2 and T1, $\Delta ph2_x(T3, T1)$ is the change in the second measurement phase value $ph2_x$ between T3 and T1, and $\Delta ph1_x(T3, T1)$ is the change in the first measurement phase value $ph1_x$ between T3 and T1.

When $L_{rat}(T2)$ is calculated, the absolute position of the movable object 200 at the second point in time T2 can be calculated as follows:

$$L_x(T2) = L_{rat}(T2) * L_{ref}(T2),$$

wherein $L_x(T2)$ is the absolute position of the movable object 200 at point in time T2, and $L_{ref}(T2)$ is the length of the reference path $L_{ref}$ at T2; it is remarked that the length of the reference path $L_{ref}$ is constant.

It is remarked that to use this embodiment of the method to calculate an absolute position of the movable object 200 $\Delta ph1_x(T3, T1)$ should not be equal to zero, i.e. there has to be some movement of the movable object 200 between T1 and T3. Also, $\Delta ph2_{ref}(T2, T1)$ should not be equal to zero, i.e. the wavelength of the further laser beam of the second light source 107 has to be changed between T2 and T1. Further, it is remarked that when the movable object 200 has not moved between T2 and T1, $\Delta ph1_x(T2, T1)$, is equal to zero and the second part of the equation $[\Delta ph1_x(T2, T1) * \Delta ph2_{ref}(T3, T1)]/[\Delta ph2_x(T3, T1) * \Delta ph2_{ref}(T2, T1)]$ will also be equal to zero. In other words, this second part of the equation provides a compensation for movement of the movable object 200 during collection of data points.

Figure 11:
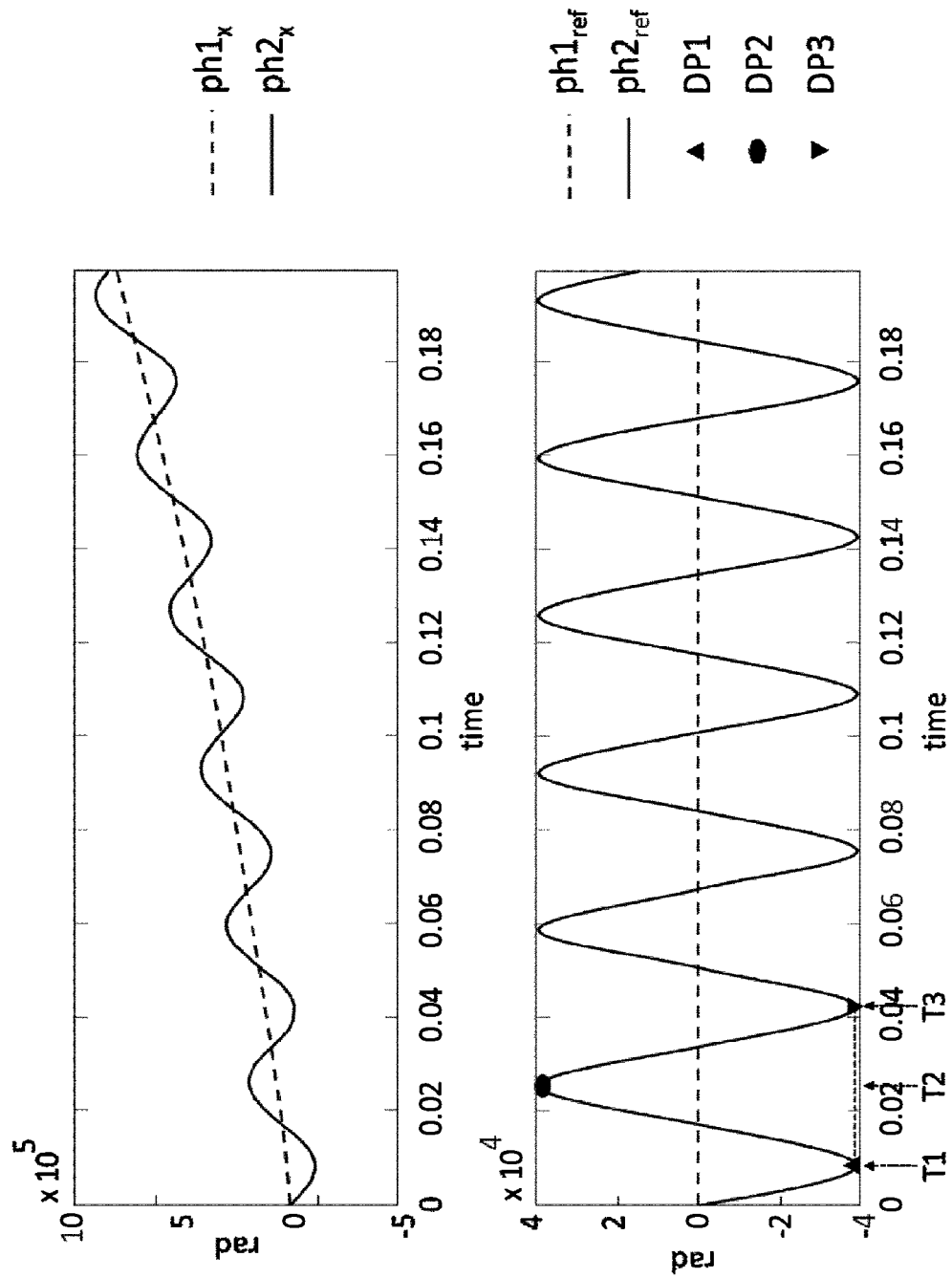
FIG. 11 shows selection of a set of data points according to a second selection criterion of a method according to an embodiment of the second aspect of the invention.

FIG. 11 shows an example of the selection of three data points according to the second embodiment. The upper part of FIG. 11 shows the first measurement phase value $ph1_x$ and the second measurement phase value $ph2_x$ over time. From the course of the first measurement phase value $ph1_x$, it can be seen that the movable object 200 moves in a single direction. The second measurement phase value $ph2_x$ shows the additional effect of the modulating frequency of the second measurement beam. Instead of moving in a single direction, the movable object 200 may also move back and forth as long as $\Delta ph1_x(T2, T1)$ is unequal to 0, or both $\Delta ph1_x(T2, T3)$ and $\Delta ph1_x(T3, T1)$ are unequal to 0.

The lower part of FIG. 11 shows the first reference phase value $ph1_{ref}$ and the second reference phase value $ph2_{ref}$ over time. Since the reflective reference surface 105 is at a fixed position, the first reference phase value $ph1_{ref}$ is constant over time. The second reference phase value $ph2_{ref}$ shows the effect of the modulating frequency of the second measurement beam.

According to the selection criterion of the second embodiment, the first data point DP1 and the third data point DP3 are selected based on the same value for the second reference phase value $ph2_{ref}$, in this case from two lower peaks of the graph of the second reference phase value $ph2_{ref}$. The second data point DP2 may be any data point having a different second reference phase value $ph2_{ref}$. Preferably, the selected second data point has a second reference phase value $ph2_{ref}$ that substantially deviates from the second reference phase value $ph2_{ref}$ of the first and third data point, such as at or near an upper peak of the graph as for example shown in FIG. 11.

In practice, multiple sets of three data points may be selected to improve the accuracy of the method. For each set of three data points an absolute position of the movable object 200 may be determined. The absolute positions of the movable object 200 determined on the basis of each set of three data points can be combined, for example averaged, to calculate a single absolute position of the movable object 200.

The advantage of the methods according to the second aspect of the invention is that the interferometer system 100 enables the determination of an absolute position of the movable object 200 with respect to a reference location without the need of separate zeroing sensors. This may allow a simpler design of the position measurement system.

Furthermore, the interferometer system 100 allows to determine an absolute position of the movable object 200 over a large working range of the position measurement system. The movable object 200 does not have to be brought within a measurement range of a specific zeroing sensor to carry out a measurement of an absolute position of the movable object 200.

Furthermore, the determination of the absolute position is made independent of movement of the movable object 200.

In an embodiment of the second aspect of the invention, there is also provided the step of determining an absolute length, in meters or similar units, of the reference path 104 of the interferometer system 100. This absolute length of the reference path 104 can be calculated as follows:

measuring a first length ratio $L_{rat1}$ between the measurement path length $L_x$ and the reference path length $L_{ref}$ for a first position pose of the movable object 200, moving the movable object 200 from the first position $pos_1$ to a second position $pos_2$, while measuring the displacement of the movable object 200 using the first measurement phase value $ph1_x$.

measuring a second length ratio $L_{rat2}$ between the measurement path length $L_x$ and the reference path length $L_{ref}$ for the second position $pos_2$ of the movable object 200, and calculating the length of the reference path $L_{ref}$ on the basis of the first length ratio $L_{rat1}$, the displacement of the movable object $\Delta ph1_x(pos_2, pos_1)$, and the second length ratio $L_{rat2}$.

This length of the reference path can be calculated as:

$$L_{ref} = L_{rat1} * (\Delta ph1_x(pos_2, pos_1) * L_{rat2}) / (L_{rat1} - L_{rat2}).$$

It is also possible to calculate the measurement path length in the first position $L_x(pos_1)$, by $$L_x(pos_1) = (\Delta ph1_x(pos_2, pos_1) * L_{rat2}) / (L_{rat1} - L_{rat2}).$$

Figure 12:
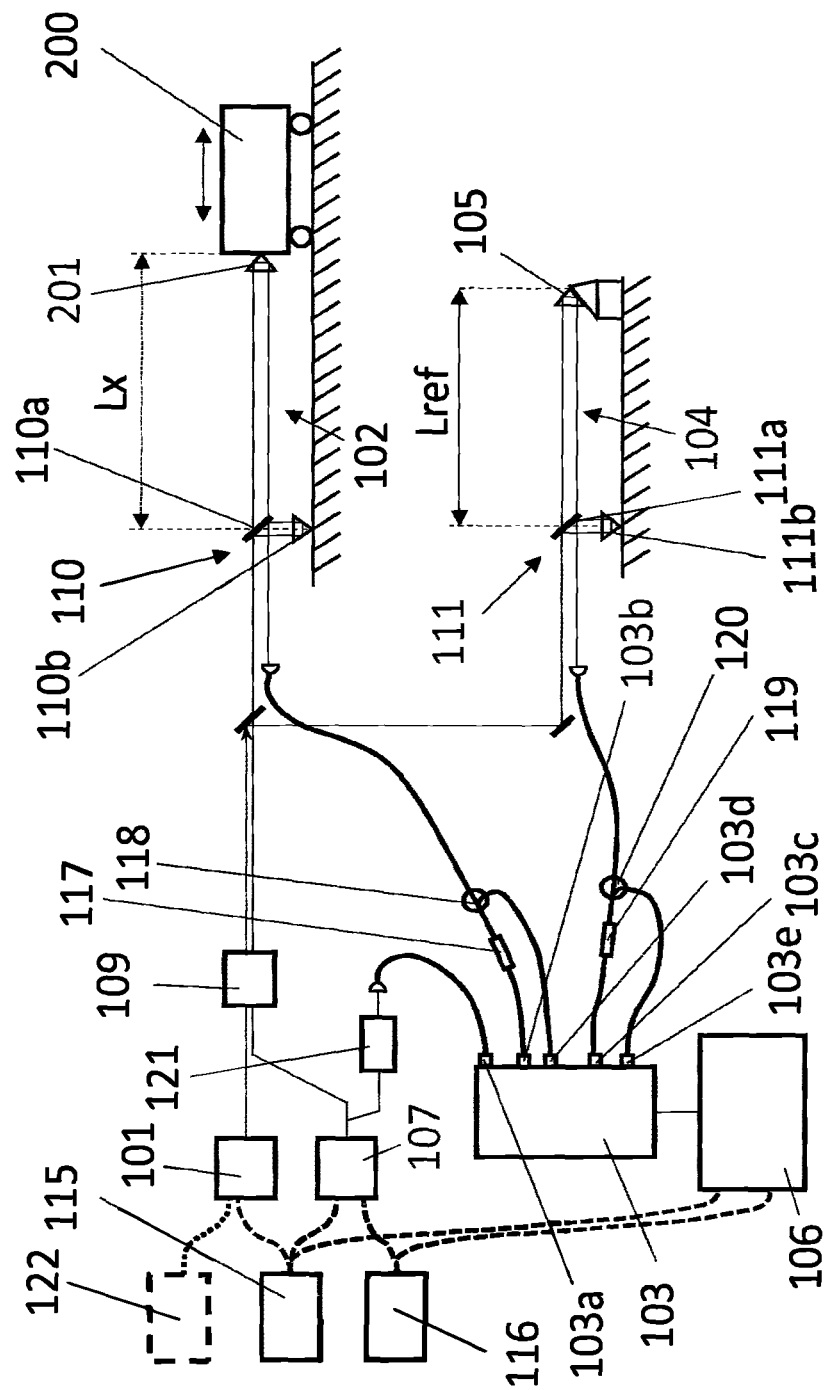
FIG. 12 shows a second embodiment of an interferometer system according to a second aspect of the invention.

FIG. 12 shows a second embodiment of an interferometer system 100 according to the second aspect of the invention. The interferometer system 100 is arranged to determine an absolute position of a movable object 200, for example a part of a projection system PS of a lithographic apparatus. The movable object 200 comprises a reflective measurement surface 201. The interferometer system 100 of the embodiment of FIG. 12 is a synthetic heterodyne interferometer system using wavelength modulation.

The interferometer system 100 comprising a first light source 101 to provide a first laser beam with a first light frequency. The first light frequency is, in this embodiment, a stabilized light frequency having a first light frequency base value modulated with a first high frequency modulation signal. The first high frequency modulation signal is provided by a high frequency modulator 115. The wavelength variation due to the high frequency modulation of the first laser beam is relatively small.

The first laser beam provided by the first light source 101 is split, for example by a beam splitter 109, into at least a first part and a second part. The first part is directed to interferometer optics 110. The interferometer optics 110 are arranged to split the first part into a first beam and a first reference beam. The first beam is guided along a measurement path 102, having a measurement path length Lx, to the reflective measurement surface 201 on the movable object 200. After the first beam is reflected by the reflective measurement surface 201, the first beam is recombined with the first reference beam in the interferometer optics 110. The recombined first beam and first reference beam are directed to a second detector 103b which is connected to light sensor device 103.

The interferometer optics 110 comprise a semitransparent mirror 110a to split the first part of the laser beam in the first beam and the first reference beam and a reflective surface 110b to reflect the first reference beam back to the semitransparent mirror 110a. In other embodiments, other interferometer optics 110 may be provided to create and recombine the first beam and the first reference beam, such as a semi-transparent mirror that is arranged perpendicular to the propagation direction of the first part and that transmits the first beam and reflects the first reference beam.

The second part of the laser beam is directed to interferometer optics 111. The interferometer optics 111 is arranged to split the second part into a second beam and a second reference beam. The second beam is guided along a reference path 104, having a reference path length Lref, to a reflective reference surface 105. After the second beam is reflected by the reflective reference surface 105, the second beam is recombined with the second reference beam in the interferometer optics 111. The recombined second beam and second reference beam are directed to a third detector 103c which is connected to the light sensor device 103.

The interferometer optics 111 comprise a semi-transparent mirror 111a to split the first part of the laser beam in the first beam and the first reference beam and a reflective surface 111b to reflect the first reference beam back to the semitransparent mirror 111a. In other embodiments, other interferometer optics 110 may be provided to create and recombine the first beam and the first reference beam, such as a semi-transparent mirror that is arranged perpendicular to the propagation direction of the first part and that transmits the first beam and reflects the first reference beam.

The reflective reference surface 105 is arranged at a fixed location that is used as reference location for measurements. The construction in which the reflective reference surface 105 is provided, is therefore intended to be inherently stable, i.e. the location of the reflective reference surface 105 with respect to the interferometer system 100 is constant. The length $L_{ref}$ of the reference path 104 is therefore also a constant length.

The interferometer system 100 comprises a second light source 107. The second light source 107 has a second light frequency. In the shown embodiment, the second light source 107 is configured to provide a second laser beam with a tunable light frequency, for example from a tunable laser source.

A low frequency modulator 116 is arranged to provide a low frequency modulation signal to the light source 107. The second light frequency is a second light frequency base value modulated with the low frequency modulation signal provided by the low frequency modulator 116. Furthermore, the second light source 107 is connected to the high frequency modulator 115 to receive the high frequency modulation signal. For allowing a synthetic heterodyne phase detection scheme, the second light frequency is also modulated with the high frequency modulation signal provided by the high frequency modulator 115.

The modulation trajectory of the low frequency modulation and the high frequency modulation may have any suitable shape, but will typically be a triangular or sinusoidal profile.

The first light frequency and the second light frequency are selected such that these are in two different non-overlapping frequency ranges. For example, the first light frequency base value is about 1510 nm, e.g. corresponding to a light frequency of c/1510e−9∼=200 THz), and the frequency is modulated with a high frequency modulation signal such that the phase modulation at the respective detector has an amplitude in the order of a single phase cycle, for example $1/8^{th}$ to 2 phase cycles, depending on the demodulation algorithm.

The phase modulation at the respective detector $\Delta\phi$ as a result of the frequency modulation $\Delta f$ of the laser source will scale linearly with the optical pathlength difference OPD of the measurement and reference path of the interferometer: $(\Delta\phi/2\pi)=OPD \cdot \Delta f/c$, (c=speed of light). Hence a smaller frequency modulation is required for a long OPD to achieve the same phase modulation at the respective detector. The high frequency modulation signal may have a frequency of for example at least 0.1 MHz, for instance in the range of 1 MHz to 30 MHz.

The second light frequency base value of the tunable frequency signal may for example be 1535 nm. The resulting amplitude of the tunable frequency signal due to the low frequency modulation signal may for example be +/−14 nm (+/−2 THz) and due to the high frequency modulation signal may for example be +0.0001 nm): $\Delta f=(c/OPD)\cdot(\Delta\phi/2\pi)$. For $1/8^{th}$ of $2\pi$ phase modulation for an OPD of 1 meter it would require c/8 Hz frequency modulation (∼=37.5 MHz modulation, or an amplitude of approximately 18.75 MHz). This results in a second frequency range of the tunable frequency signal of 1520 nm-1550 nm. The low frequency modulation signal may have a frequency of for example less than 1000 Hz, for instance in the range of 0.1 Hz to 100 Hz.

The second laser beam as provided by the second light source 107 is split, for example by a beam splitter 109, in a further first part and a further second part. Similar to the first part, the further first part is directed to interferometer optics 110. The interferometer optics 110 are arranged to split the further first part into a further first beam and a further first reference beam. The further first beam is guided along the measurement path 102, having the measurement path length $L_x$, to the reflective measurement surface 201 on the movable object 200. After the further first beam is reflected by the reflective measurement surface 201, the further first beam is recombined with the further first reference beam in the interferometer optics 110.

The recombined further first beam and further first reference beam are directed, corresponding to the first beam and the first reference beam, towards the detector 103b which is connected to the light sensor device 103. However, a first optical filter unit 117 provided in the path towards the detector 103b is arranged to transmit the first beam and the first reference beam and to reflect the further first beam and the further first reference beam. The first optical filter unit 117 is for example a Fibre Bragg grating that reflects light having a light frequency in the second frequency range of 1520 nm-1550 nm and does not reflect light having a light frequency in the first frequency range of 1509 nm-1511 nm.

The reflected further first beam and the further first reference beam are guided via an optical circulator 118 to a fourth detector 103d.

The further second part of the second laser beam is directed to interferometer optics 111. The interferometer optics 111 are arranged to split the further second part into a further second beam and a further second reference beam. The further second beam is guided along the reference path 104, having the reference path length $L_{ref}$, to the reflective reference surface 105. After the further second beam is reflected by the reflective reference surface 105, the further second beam is recombined with the further second reference beam in the interferometer optics 111.

The recombined further second beam and further second reference beam are directed, corresponding to the second beam and the second reference beam, towards the detector 103c which is connected to the light sensor device 103. However, a second optical filter unit 119 provided in the path towards the detector 103c is arranged to transmit the second beam and the second reference beam and to reflect the further second beam and the further second reference beam. The second optical filter unit 119 is for example a Fibre Bragg grating that reflects light having a light frequency in the second frequency range of 1520 nm-1550 nm and does not reflect light having a light frequency in the first frequency range of 1509 nm-1511 nm. The first optical filter unit 117 and the second optical filter unit 119 may be any optical filter unit arranged to split the combination of a beam, a reference beam, a further beam and a further reference beam into the beam and the reference beam and the further beam and the further reference beam. This split can be made on the basis of the first frequency range and the second frequency range. The first optical filter unit may for example be a band filter, a low pass filter or a high pass filter.

The reflected further second beam and the further second reference beam are guided via a second optical circulator 120 to a fifth detector 103e.

A third part of the second laser beam is directed to a first detector 103a which is connected to a first light diode of the light sensor device 103. This third part of the second laser beam has not interacted with the reflective measurement surface 201 or the reflective reference surface 105. In the shown embodiment the third part of the second laser beam is guided through a gas absorption cell 121. The gas absorption cell 121 is used to absorb one or more specific light wavelengths of the third part of the second laser beam. Typically, when the second light frequency will sweep through the second frequency range, the second light frequency will pass one or more specific wavelengths absorbed by the gas absorption cell 121. The gas absorption cell 121 is calibrated such that the specific wavelengths absorbed by the gas absorption cell 121 are known. These specific wavelengths can be determined on the basis of the measurement signal received by the first detector 103a. This information can be fed into the processing unit 106 to calibrate the wavelength of the second light frequency received at the third detector 103c and the fifth detector 103e. Also other types of calibrated references may be used to calibrate the wavelength of the second light frequency received at the third detector 103c and the fifth detector 103e, such as a wavelength meter comprising a Twyman-Green interferometer using a comparison against another known wavelength, a wavelength meter using a comparison against another wavelength via a frequency comb, or other suitable methods.

In an alternative embodiment, a gas absorption cell may directly be used as a reference for the measurements. In such embodiment, the gas absorption cell will replace the measurement of the reflective reference surface 105.

In an embodiment, also a third part of the first laser beam of the first laser source 101 may be guided via a gas absorption cell to a detector of the light sensor device 103. The signal received by this detector may be used for frequency stabilization of the first laser beam.

As explained above, the second detector 103b propagates the recombined first beam and first reference beam onto a second light diode of the light sensor device 103. The third detector 103c propagates the recombined second beam and second reference beam onto a third light diode of light sensor device 103. The fourth detector 103c propagates the recombined further first beam and further first reference beam onto a fourth light diode of the light sensor device 103. And, the fifth detector 103e propagates the recombined further second beam and further second reference beam onto a fifth light diode of the light sensor device 103.

The measurements of the light diodes are fed into the processing unit 106. The processing unit 106 generates a first measurement phase value $ph1_x$ based on the input by the detector 103b and a first reference phase value $ph1_{ref}$ based on the input by the detector 103c. The first measurement phase value $ph1_x$ represents a distance or displacement of the measurement object 200, i.e., the measurement path length $L_x$. The first reference phase value $ph1_{ref}$ represents the reference path length $L_{ref}$, which is a constant length.

The processing unit 106 generates a second measurement phase value $ph2_x$ based on the input by the detector 103d and a second reference phase value $ph2_{ref}$ based on the input by the detector 103e. The second measurement phase value $ph2_x$ represents a distance or displacement of the measurement object 200, i.e., the measurement path length $L_x$. The second reference phase value $ph2_{ref}$ represents the reference path length $L_{ref}$, which is a constant length.

The modulation of the first laser beam and the second laser beam is used to determine the first measurement phase value $ph1_x$, the first reference phase value $ph1_{ref}$, the second measurement phase value $ph2_x$, and the second reference phase value $ph2_{ref}$. Each interferometer signal, as received by one of the second detector 103b, third detector 103c, fourth detector 103d and fifth detector 103e, is demodulated in an odd harmonic signal and even harmonic signal of the modulation frequency. The amplitudes of these odd harmonic and even harmonic signals of the modulation frequency may be used to construct a phase quadrature signal on the basis of which the first measurement phase value $ph1_x$, the first reference phase value $ph1_{ref}$, the second measurement phase value $ph2_x$, and the second reference phase value $ph2_{ref}$ can respectively be determined.

Optionally, the frequencies as provided by the high frequency modulator 115 and the low frequency modulator 116 may be fed into the processing unit 106. These frequencies may be used as inputs for the demodulation of the interferometer signals.

On the basis of the first measurement phase value $ph1_x$, the first reference phase value $ph1_{ref}$, the second measurement phase value $ph2_x$, and the second reference phase value $ph2_{ref}$, an absolute position and a change in the position of the movable object 200 may be determined, as explained hereinabove with respect to the embodiment shown in FIG. 8.

An advantage of the embodiment of FIG. 12 is that the first frequency of the first laser beam and the second frequency of the second laser beam are different and non-overlapping. This difference in frequency ranges allows to split the first beam and first reference beam from the further first beam and the further first reference beam at the first optical filter unit 117 and to split the second beam and second reference beam from the further second beam and the further second reference beam at the second optical filter unit 119.

An advantage of this splitting is that the combination of the first beam and first reference beam, the combination of the further first beam and the further first reference beam, the combination of the second beam and the second reference beam and the combination of the further second beam and the further second reference beam are each received at one of the four detectors 103b, 103c, 103d, 103e, allowing that the 0th and 1st harmonics can be used of the signals that are associated with the respective wavelength modulation to create a phase quadrature signal. This results typically in lower noise levels compared with using, for example the 1st and 2nd harmonics of the respective signals. The use of the 0th harmonic is possible since the respective beams are optically separated by means of the first optical filter unit 117 and the second optical filter unit 119.

A further advantage thereof is that the full analog-to-digital range of each channel in the light sensor device 103 can be dedicated to the detection of a single phase, i.e. one of the combinations of the first beam and first reference beam, the further first beam and the further first reference beam, the second beam and the second reference beam and the further second beam and the further second reference beam. As a result, lower noise level may be obtained as opposed to an embodiment in which a mixed interference signal of two light sources 101, 107 lasers is detected by a single detector.

Another advantage of the splitting of a beam and a reference beam from a further beam and a further reference beam is that the same high frequency modulation signal of high frequency modulator 115 may be used for both the first laser beam of the first light source 101 and the second laser beam of the second laser source 107. As a result, only one high frequency modulator 115 is required for the first light source 101 and the second light source 107.

Nevertheless, some of the advantages as described above resulting from the splitting of a beam and a reference beam from a further beam and a further reference beam using the first filter unit 117 and/or the second filter unit 119 may also be used in an embodiment of the interferometer system 100, in which the first laser beam is modulated with a second high frequency modulation signal provided by a second high frequency modulator 122 (shown in dashed lines in FIG. 12), while the second laser beam is modulated with the high frequency modulation signal provided by the high frequency modulator 115.

In the embodiment of FIG. 12, the interferometer system 100 is a single pass interferometer system. In alternative embodiments, also multiple-pass systems may be applied. The beams used for measurement of the reflective measurement surface 201 and the reflective reference surface may be of any suitable type, such as a collimated beam or a focused beam.

In the embodiment of FIG. 12, the first frequency, i.e. a relatively small wavelength variation of the stabilized first frequency of the first laser source 101, and the second frequency range resulting from the tuning the wavelength using the low frequency modulation signal, are non-overlapping. Alternatively, the first frequency and the second frequency range may overlap. Since the frequency range of the second frequency range is substantially larger than the variation of the first frequency, a substantial part of the measurements can still be used to determine the first measurement phase value $ph1_x$, the first reference phase value $ph1_{ref}$, the second measurement phase value $ph2_x$, and the second reference phase value $ph2_{ref}$. Only when the first light frequency and the second light frequency are the same, typically when the frequency of the second light frequency is close to the first light frequency, the measured values cannot be reliably used to determine the respective phase values.

In an embodiment, optical fibers may be used to guide the first and second laser beams, or parts thereof. Fiber-type optical beam splitters and optical circulators may be used to split the laser beams in parts and to guide the laser beams or laser beam parts along the desired optical paths.

Figure 13:
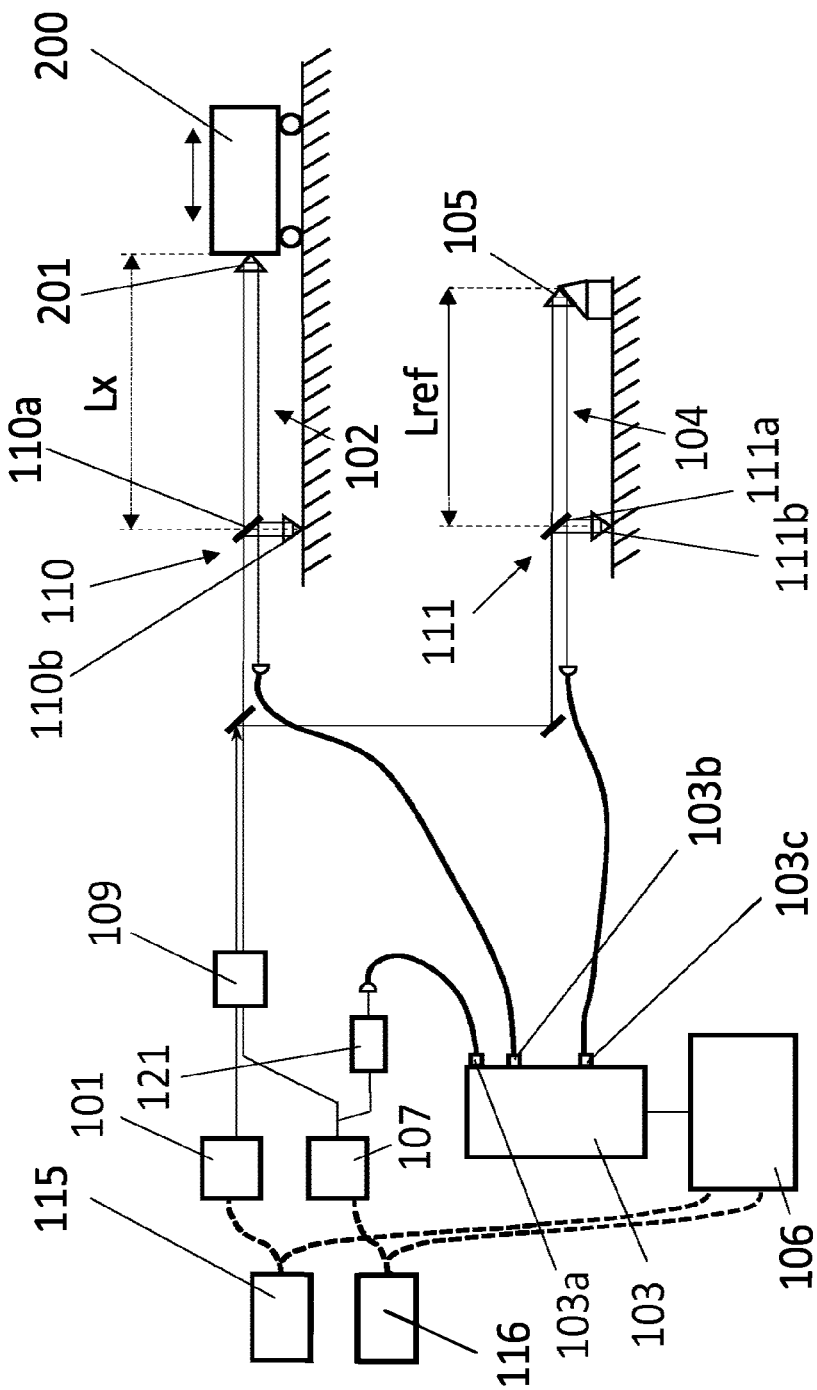
FIG. 13 shows a third embodiment of an interferometer system according to a second aspect of the invention.

FIG. 13 shows a third embodiment of an interferometer system 100 according to the second aspect of the invention. Similar parts or parts having substantially the same function are indicated by the same reference numerals.

In this embodiment the high frequency modulator 115 is arranged to provide a high frequency modulation signal to modulate the first laser beam of the first light source 101. The low frequency modulator 116 is provided to modulate the second laser beam provided by the second laser light source 107. The wave length variation due to the high frequency modulation of the first laser beam is relatively very small with respect to the wave length variation due to the low frequency modulation of the second laser beam. The second light frequency is not modulated with a high frequency modulation signal.

Corresponding to the embodiment of FIG. 12, the first laser beam is split, for example by beam splitter 109, into a first part and a second part. The first part is split in a first beam that is guided along the measurement path 102 and a first reference beam. The second part is split in a second beam that is guided along the reference path 104 and a second reference beam. The second laser beam is split, for example by beam splitter 109, into a further first part and a further second part. The further first part is split in a further first beam that is guided along the measurement path 102 and a further first reference beam. The further second part is split in a further second beam that is guided along the reference path 104 and a further second reference beam.

The second detector 103b receives the combination of the first beam and the first reference beam and the combination of the further first beam and the further first reference beam. The third detector 103c receives the combination of the second beam and the second reference beam and the combination of the further second beam and the further second reference beam.

The measurements of the light diodes associated with the second detector 103b and the third detector 103c are fed into the processing unit 106. The processing unit 106 generates a first measurement phase value $ph1_x$ based on the input by the detector 103b and a first reference phase value $ph1_{ref}$ based on the input by the detector 103c. The first measurement phase value $ph1_x$ represents a distance or displacement of the measurement object 200, i.e., the measurement path length $L_x$. The first reference phase value $ph1_{ref}$ represents the reference path length $L_{ref}$ which is a constant physical length. Thus, any changes measured in the reference path length $L_{ref}$ are caused by a change in laser frequency and/or refractive index, i.e. optical length. The processing unit 106 further generates a second measurement phase value $ph2_x$ based on the input by the second detector 103b and a second reference phase value $ph2_{ref}$ based on the input by the detector 103c. The second measurement phase value $ph2_x$ represents a distance or displacement of the measurement object 200, i.e., the measurement path length $L_x$. The second reference phase value $ph2_{ref}$ represents the reference path length $L_{ref}$, which is a constant physical length.

The high frequency modulation of the first laser beam is used to determine the first measurement phase value $ph1_x$ and the first reference phase value $ph1_{ref}$. The phase quadrature signals that are used to construct the first measurement phase value $ph1_x$ are obtained by determining the frequency power of an odd and an even harmonic from the frequency content in the respective interferometer signal obtained by the second detector 103b that comprises the first beam and the first reference beam and that can be associated with the frequency of the high frequency modulation signal. Correspondingly, the phase quadrature signals that are used to construct the first reference phase value $ph1_{ref}$ are obtained by determining the frequency power of an odd and an even harmonic from the frequency content in the respective interferometer signal obtained by the third detector 103c that comprises the second beam and the second reference beam and that can be associated with the frequency of the high frequency modulation signal.

The low frequency modulation of the second laser beam is used to determine the second measurement phase value $ph2_x$ and the second reference phase value $ph2_{ref}$. The second measurement phase value $ph2_x$ can be obtained by determining the phase of an interference signal that has a frequency $F_{demod}$ that equals:

$$F_{demod}=LF_{mod}*OPD/c$$

wherein $LF_{mod}$ is a sweep rate of the frequency of the low frequency modulation signal provided by low frequency modulator 116 (in Hz/s), OPD is the optical path length difference (in m) between the measurement path length $L_x$ of the measurement path 104 and the reference path length $L_{ref}$ of the reference path 104, and c is the velocity of light (in m/s).

Various frequency phase analysis techniques can be applied to achieve this, for example by demodulation with a cosine and a sine demodulation signal that has a frequency at least approximately equal to the frequency $F_{demod}$. On the basis of this frequency phase analysis technique, the second measurement phase value $ph2_x$ and the second reference phase value $ph2_{ref}$ can be obtained.

Optionally, the frequencies as provided by the high frequency modulator 115 and the low frequency modulator 116 may be fed into the processing unit 106. These frequencies may be used as inputs for the demodulation of the interferometer signals as received by the second detector 103b and the third detector 103c.

Further, optical filter units may be provided to split, on the basis of the respective frequency ranges, the light originating from the first laser beam and the second laser beam, such that for each combination of a beam and a reference beam a dedicated detector and optical channel in the light sensor device 103 may be provided.

Once the first measurement phase value $ph1_x$, the first reference phase value $ph1_{ref}$, the second measurement phase value $ph2_x$, and the second reference phase value $ph2_{ref}$ are determined, an absolute position and/or a relative position change of the reflective measurement surface 201 may be determined with the interferometer system 100 using the techniques as described with respect to the embodiment of FIG. 8.

Hereinabove, embodiments of interferometer systems are shown in which some optical paths are defined in free space and some are defined by optical fibers. In alternative embodiments, optical paths in free space may also be provided by optical fibers, and optical paths defined by optical fibers may be provided in free space. In an embodiment of the interferometer system, the optical paths are mainly defined by optical fibers, whereby for example the measurement path $L_x$ and the reference path $L_{ref}$ are defined in free space.

The present invention may also be described by the following clauses:

1. A wavelength tracking system comprising:
   a wavelength tracking unit with reflection surfaces at stabile positions providing a first reflection path with a first path length and a second reflection path with a second path length, wherein the first path length is substantially larger than the second path length, and
   an interferometer system, wherein the interferometer system comprises:
      a beam splitter to split a light beam in a first measurement beam and a second measurement beam,
      at least one optic element to guide the first measurement beam, at least partially, along the first reflection path and the second measurement beam, at least partially, along the second reflection path,
      a first light sensor arranged at an end of the first reflection path to receive the first measurement beam and to provide a first sensor signal on the basis of the first measurement beam,
      a second light sensor arranged at an end of the second reflection path to receive the second measurement beam and to provide a second sensor signal on the basis of the second measurement beam, and
   a processing unit to determine a wavelength or change in wavelength on the basis of the first sensor signal and the second sensor signal.

2. The wavelength tracking system of clause 1, wherein the processing unit is arranged to subtract the second sensor signal from the first sensor signal to determine a wavelength or change in wavelength.

3. The wavelength tracking system of clause 1 or 2, wherein interferometer system comprises a light beam source, in particular a laser beam source, to provide the light beam.

4. The wavelength tracking system of any of the preceding clauses, wherein the beam splitter is a non-polarizing beam splitter.

5. The wavelength tracking system of any of the preceding clauses, wherein the at least one optic element is arranged to split the first measurement beam in a first reflection path beam and a first reference beam, wherein the first reflection path beam is guided along the first reflection path to the first light sensor, and wherein the first reference beam is guided along a first reference path to the first light sensor without being reflected by reflection surfaces of the wavelength tracking unit, and
   wherein the at least one optic element is arranged to split the second measurement beam in a second reflection path beam and a second reference beam, wherein the second reflection path beam is guided along the second reflection path to the second light sensor, and wherein the second reference beam is guided along a second reference path to the second light sensor without being reflected by reflection surfaces of the wavelength tracking unit.

6. The wavelength tracking system of clause 5, wherein the at least one optic element comprises:
   a polarizing beam splitter to split the first measurement beam in the first reflection path beam and the first reference beam and to split the second measurement beam in the second reflection path beam and the second reference beam.

7. The wavelength tracking system of clause 5 or 6, wherein the at least one optic element comprises one or more reference reflection mirrors arranged in the first reference path and the second reference path.

8. The wavelength tracking system of any of the preceding clauses, wherein the wavelength tracking system comprises a first measurement plane and a second measurement plane, wherein the first measurement plane is parallel to the second measurement plane, wherein the light beam source is arranged in the first measurement plane and wherein the first light sensor and the second light sensor are arranged in the second measurement plane.

9. The wavelength tracking system of any of the clauses 1-7 and clause 8, wherein the at least one optic element comprises a corner cube to transfer the first reflection path beam, the first reference beam, the second reflection path beam and/or the second reference beam from the first measurement plane to the second measurement plane.

10. The wavelength tracking system of any of the preceding clauses, wherein the wavelength tracking unit comprises at least one wavelength tracking cavity comprising a cavity opening, wherein the cavity comprises one or more first reflection path reflections surfaces arranged in the first reflection path, and wherein at least one second reflection path reflection surface arranged in the second reflection path is provided next to the cavity opening.

11. The wavelength tracking system of clause 6, 7 and 9, wherein the beam splitter, the polarizing beam splitter, the one or more reference reflection mirrors and the corner cube are provided in a single optical element unit.

12. A method to calibrate a wavelength tracking system according to any of the preceding clauses, comprising the steps of:
   moving the wavelength tracking unit in a measurement direction relative to the interferometer system, obtaining the first sensor signal from the first sensor and the second sensor signal of the second sensor,
   determining non-linearity of the first reflection path of the wavelength tracking system on the basis of the first sensor signal, and/or
   determining non-linearity of the second reflection path of the wavelength tracking system on the basis of the second sensor signal.

13. A lithographic apparatus comprising:
   a conditioned space,
   a movable object arranged within the conditioned space,
   an interferometer position measurement system to measure a position of the movable object within the conditioned space, and
   the wavelength tracking system of any of the preceding clauses,
   wherein the interferometer position measurement system is arranged to receive a wavelength or change in wavelength as determined by the wavelength tracking system and to compensate measurements of the interferometer position measurement system for the wavelength or change in wavelength.

14. The lithographic apparatus of clause 13, wherein the conditioned space is a reduced pressure space.

15. The lithographic apparatus of clause 13, wherein the movable object is an optic element of a projection optics box of the lithographic apparatus or a substrate support of the lithographic apparatus.

16. A method to determine an absolute position of a movable object with respect to a reference location using an interferometer system, wherein said interferometer system comprises:
- a first light source arranged to provide a first beam and a second beam with a first light frequency;
- a second light source arranged to provide a further first beam and a further second beam with a second light frequency, wherein the second light frequency is a tunable light frequency;

said method comprising the steps of:
- projecting simultaneously the first beam and the further first beam along a measurement path on a reflective surface of the movable object and projecting the second beam and the further second beam along a reference path on a reference mirror while changing the tunable light frequency of the second light source, the reference path having a fixed length,
- determining a first measurement phase value based on the first beam, a second measurement phase value based on the further first beam, a first reference phase value based on the second beam and a second reference phase value based on the further second beam,
- determining the absolute position based on the first measurement phase value, the second measurement phase value, the first reference phase value and the second reference phase value.

17. The method of clause 16, wherein a data point is a combination of the first measurement phase value, the second measurement phase value, the first reference phase value and the second reference phase value at a single point in time,
wherein the method comprises a step of collecting a plurality of data points, wherein the first measurement phase value is the same in each data point.

18. The method of clause 17, comprising moving the object back and forth in a position range when collecting the plurality of data points.

19. The method of clause 18, wherein moving the object back and forth forms a vibrating movement.

20. The method of any of the clauses 17-19, wherein the step of collecting the plurality of data points is repeated so as to create multiple sets of plurality of data points, wherein the first measurement phase value is different for each of the multiple sets.

21. The method of clause 16, wherein a data point is a combination of the first measurement phase value, the second measurement phase value, the first reference phase value and the second reference phase value at a single point in time,
wherein the method comprises a step of collecting a first data point, a second data point and a third data point, wherein the second data point is different from the first data point, wherein the first data point and the third data point have the same second reference phase value, wherein the second data point has a second reference phase value different from the second reference phase value of the first data point and the third data point.

22. The method of clause 21, comprising using the step of collecting a first data point, a second data point and a third data point when the movable object makes a movement in a single direction.

23. The method of clause 22, comprising
determining the absolute position based on
a change in the second measurement phase value between the second data point and the first data point,
a change in the second reference phase value between the second data point and the first data point,
a change in the first measurement phase value between the second data point and the first data point,
a change in the second measurement phase value between the third data point and the first data point, and
a change in the first measurement phase value between the third data point and the first data point.

24. The method of any of the clauses 21-23, comprising repeating the step of collecting the first data point, the second data point and the third data point so as to collect multiple sets of three data points, and wherein the step of determining the absolute position of the movable object is based on combining, for example averaging, the absolute positions determined on the basis of each set of three data points.

25. The method of any of the clauses 21-24, wherein the method further comprises the step of determining an absolute length of the reference path of the interferometer system.

26. The method of clause 25, wherein the step of determining the absolute length of the reference path comprises:
- measuring a first length ratio between the measurement path length and the reference path length at a first position of the movable object,
- moving the movable object from the first position to a second position, while measuring the displacement of the movable object using the first beam and the second beam,
- measuring a second length ratio between the measurement path length and the reference path length at the second position of the movable object, and
- calculating the length of the reference path on the basis of the first length ratio, the displacement of the movable object, and the second length ratio.

27. The method of any of the clauses 16-26, wherein the first light frequency is a fixed light frequency value.

28. The method of any of the clauses 16-26, wherein the first light frequency is a tunable light frequency, wherein the tunable light frequency comprises a first light frequency base value modulated with a first high frequency modulation signal.

29. The method of any of the clauses 16-28, wherein the second light frequency is a second light frequency base value modulated with a low frequency modulation signal.

30. The method of clauses 28 and 29, wherein the modulated first light frequency has a first frequency variation and the modulated second light frequency has a second frequency variation, wherein the first frequency variation is smaller than the second frequency variation.

31. The method of clause 30, wherein the second light frequency further is modulated with a second high frequency modulation signal.

32. The method of clause 31, wherein the first light frequency is modulated within a first frequency range and wherein the second light frequency is modulated in a second frequency range, wherein the first frequency range and the second frequency range are non-overlapping.

33. The method of clause 32, wherein the method comprises
- optically splitting the light received from the measurement path in a first measurement path beam containing light originating from the first beam and a second measurement path beam containing light originating from the further first beam, and/or
- optically splitting the light received from the reference path in a first reference path beam containing light originating from the second beam and a second reference path beam containing light originating from the further second beam,
wherein optically splitting comprises filtering light within the first frequency range from light within the second frequency range.

34. The method of any of the clauses 28-33, wherein determining the first measurement phase value, the second measurement phase value, the first reference phase value and/or the second reference phase value, is based on demodulation of an odd harmonic and an even harmonic of a respective modulation signal.

35. The method of clause 34, wherein the method comprises measuring the first high frequency modulation signal, the second high frequency modulation signal and/or the low frequency modulation signal and using the respective measured modulation signal as input for demodulation of an odd harmonic and an even harmonic of the respective modulation signal.

36. The method of any of the clauses 16-35, wherein the method comprises the step of determining an absolute frequency of the second light frequency using a calibrated reference.

37. The method of any of the clauses 16-36, wherein the interferometer system is a heterodyne interferometer system or a synthetic heterodyne interferometer system.

38. An interferometer system to determine a position of a movable object having a reflective measurement surface, comprising:
 a first light source to provide a first beam and a second beam with a first light frequency,
 a second light source to provide a further first beam and a further second beam with a second light frequency, wherein the second light frequency is a tunable light frequency,
 a reflective reference surface,
 a light sensor,
 wherein the interferometer system is arranged to perform the method of any one of clauses 16-37.

39. The interferometer system of clause 38, wherein the interferometer system comprises at least one high frequency modulator to provide a first high frequency modulation signal, wherein the first light frequency is modulated with the first high frequency modulation signal.

40. The interferometer system of clause 38 or 39, wherein the interferometer system comprises at least one high frequency modulator to provide, wherein the tunable light frequency is modulated with the second high frequency modulation signal.

41. The interferometer system of clause 39 and 40, wherein the first high frequency modulation signal and the second high frequency modulation signal have the same frequency, and wherein the first high frequency modulation signal and the second high frequency modulation signal are preferably provided by the same high frequency modulator.

42. The interferometer system of any of the clauses 38-41, wherein the interferometer system comprises at least one low frequency modulator to provide a first low frequency modulation signal, wherein the tunable light frequency is modulated with the first low frequency modulation signal.

43. The interferometer system of any of the clauses 38-42, wherein the interferometer system comprises.
 a first frequency based light splitter to split light received from the measurement path in a first measurement path beam containing light originating from the first beam and a second measurement path beam containing light originating from the second beam, and/or
 a second frequency based light splitter to split light received from the reference path in a first reference path beam containing light originating from the further first beam and a second reference path beam containing light originating from the further second beam.

44. The interferometer system of any of the clauses 38-43, wherein the interferometer system comprises a calibrated reference to determine an absolute frequency of the tunable light frequency.

45. A lithographic apparatus, comprising the interferometer system of any of the clauses 39-44.

46. The lithographic apparatus of clause 45, wherein the movable object is part of a projection system of the lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:
1. A wavelength tracking system comprising:
 a wavelength tracking unit with reflection surfaces disposed at a constant distance from each other and configured to provide a first reflection path with a first path length and a second reflection path with a second path length, wherein:
  the wavelength tracking unit comprises a wavelength tracking cavity comprising a cavity opening,
  the cavity comprises a first reflection path reflection surface within the cavity and arranged in the first reflection path and a second reflection path reflection surface arranged outside the cavity in the second reflection path next to the cavity opening, and
  the first path length is substantially larger than the second path length based on the second reflection path not traversing the cavity, and
an interferometer system, wherein the interferometer system comprises:
  a beam splitter to split a light beam into a first measurement beam and a second measurement beam, at least one optic element to guide the first measurement beam, at least partially, along the first reflection path and the second measurement beam, at least partially, along the second reflection path,
  a first light sensor arranged at an end of the first reflection path to receive the first measurement beam and to provide a first sensor signal on the basis of the first measurement beam,
  a second light sensor arranged at an end of the second reflection path to receive the second measurement beam and to provide a second sensor signal on the basis of the second measurement beam, and
  a processing unit to determine a wavelength or change in wavelength based on the first sensor signal and the second sensor signal.

2. The wavelength tracking system of claim 1, wherein the processing unit is arranged to subtract the second sensor signal from the first sensor signal to determine a wavelength or change in wavelength.

3. The wavelength tracking system of claim 1, wherein the interferometer system comprises a light or laser beam source to provide the light beam.

4. The wavelength tracking system of claim 1, wherein the beam splitter is a non-polarizing beam splitter.

5. The wavelength tracking system of claim 1, wherein:
  the at least one optic element is arranged to split the first measurement beam into a first reflection path beam and a first reference beam,
  the first reflection path beam is guided along the first reflection path to the first light sensor,
  the first reference beam is guided along a first reference path to the first light sensor without being reflected by the reflection surfaces of the wavelength tracking unit,
  the at least one optic element is arranged to split the second measurement beam into a second reflection path beam and a second reference beam,
  the second reflection path beam is guided along the second reflection path to the second light sensor, and
  the second reference beam is guided along a second reference path to the second light sensor without being reflected by the reflection surfaces of the wavelength tracking unit.

6. The wavelength tracking system of claim 5, wherein the at least one optic element comprises:
  a polarizing beam splitter to split the first measurement beam into the first reflection path beam and the first reference beam and to split the second measurement beam into the second reflection path beam and the second reference beam.

7. The wavelength tracking system of claim 5, wherein the at least one optic element comprises one or more reference reflection mirrors arranged in the first reference path and the second reference path.

8. The wavelength tracking system of claim 1, further comprising:
  a first measurement plane and a second measurement plane,
  wherein the first measurement plane is parallel to the second measurement plane,
  wherein a light beam source is arranged in the first measurement plane, and
  wherein the first light sensor and the second light sensor are arranged in the second measurement plane.

9. The wavelength tracking system of claim 7, wherein the at least one optic element comprises a corner cube configured to transfer the first reflection path beam, the first reference beam, the second reflection path beam or the second reference beam from the first measurement plane to the second measurement plane.

10. The wavelength tracking system of claim 9, wherein the beam splitter, a polarizing beam splitter, the one or more reference reflection mirrors and the corner cube are provided in a single optical element unit.

11. A method comprising:
  moving a wavelength tracking unit in a measurement direction relative to a interferometer system, wherein the wavelength tracking unit comprises a cavity having an opening;
  splitting a light beam into a first measurement beam and a second measurement beam;
  guiding the first measurement beam along a first reflection path through the cavity opening into the cavity to a first reflection path reflection surface within the cavity and then to a first sensor disposed outside of the cavity;
  guiding the second measurement beam along a second reflection path outside of the cavity to a second reflection path reflection surface arranged outside the cavity and next to the cavity opening to a second sensor disposed outside of the cavity;
  obtaining a first sensor signal from the first sensor and a second sensor signal from the second sensor;
  determining a non-linearity of a first reflection path of the wavelength tracking system on the basis of the first sensor signal; and
  determining a non-linearity of a second reflection path of the wavelength tracking system on the basis of the second sensor signal.

12. A lithographic apparatus comprising:
a conditioned space;
a movable object arranged within the conditioned space;
an interferometer position measurement system to measure an absolute position of the movable object within the conditioned space; and
the wavelength tracking system of claim 1, wherein the interferometer position measurement system is arranged to receive a wavelength or change in wavelength as determined by the wavelength tracking system and is configured to compensate measurements of the interferometer position measurement system for the wavelength or change in wavelength, and wherein the measurement of the absolute position is independent of a movement of the movable object.

13. The lithographic apparatus of claim 12, wherein the conditioned space is a reduced pressure space.

14. The lithographic apparatus of claim 12, wherein the movable object is an optic element of a projection optics box of the lithographic apparatus or a substrate support of the lithographic apparatus.

\* \* \* \* \*